United States Patent
Cowles et al.

(10) Patent No.: US 7,696,790 B2
(45) Date of Patent: Apr. 13, 2010

(54) LOW CURRENT WIDE VREF RANGE INPUT BUFFER

(75) Inventors: Timothy B. Cowles, Boise, ID (US); Steve Casper, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/268,782

(22) Filed: Nov. 11, 2008

(65) Prior Publication Data

US 2009/0085613 A1  Apr. 2, 2009

Related U.S. Application Data

(60) Continuation of application No. 11/003,766, filed on Dec. 6, 2004, now Pat. No. 7,459,944, which is a division of application No. 10/161,601, filed on Jun. 5, 2002, now Pat. No. 6,864,725.

(51) Int. Cl.
  *H03K 5/22*  (2006.01)
(52) U.S. Cl. ............................. 327/65; 327/563; 330/253
(58) Field of Classification Search ............... 327/65, 327/563; 330/253
  See application file for complete search history.

(56) References Cited

U.S. PATENT DOCUMENTS

| | | | |
|---|---|---|---|
| 5,291,149 A | 3/1994 | Nunoshima | |
| 5,767,664 A * | 6/1998 | Price | 323/313 |
| 5,942,940 A | 8/1999 | Dreps et al. | |
| 5,963,053 A | 10/1999 | Manohar et al. | |
| 5,990,708 A | 11/1999 | Hu | |
| 6,005,440 A | 12/1999 | Okamoto | |
| 6,049,229 A | 4/2000 | Manohar et al. | |
| 6,066,985 A | 5/2000 | Xu | |
| 6,118,318 A | 9/2000 | Fifield et al. | |
| 6,169,424 B1 | 1/2001 | Kurd | |
| 6,252,435 B1 | 6/2001 | Wu et al. | |
| 6,310,520 B1 | 10/2001 | Walden | |
| 6,392,453 B1 | 5/2002 | Morzano et al. | |
| 6,433,637 B1 | 8/2002 | Sauer | |
| 6,452,429 B1 | 9/2002 | Lim | |
| 6,731,169 B2 | 5/2004 | Tsukagoshi et al. | |
| 6,798,276 B2 | 9/2004 | Mori et al. | |
| 6,844,781 B1 | 1/2005 | Walsh et al. | |
| 6,864,725 B2 | 3/2005 | Cowles et al. | |
| 6,970,022 B1 | 11/2005 | Miller | |

* cited by examiner

*Primary Examiner*—Kenneth B. Wells
(74) *Attorney, Agent, or Firm*—Dickstein Shapiro LLP

(57) ABSTRACT

A low-current input buffer is disclosed. The buffer uses self-biased N and P channel differential pairs with their outputs tied together. The self-biasing assists in reducing current consumption. The combination of N and P-channel differential pairs results in symmetry across a wide range of reference and supply voltages.

18 Claims, 53 Drawing Sheets

LOW CURRENT WIDE VREF RANGE INPUT BUFFER

This application is a continuation of application no. 11/003,766, filed Dec. 6, 2004, now U.S. Pat. No. 7,459,944, which is a divisional of application no. 10/161,601, filed Jun. 5, 2002, now U.S. Pat. No. 6,864,725, the contents of which are hereby incorporated by reference in their entireties.

FIELD OF THE INVENTION

The invention relates to a low-current differential buffer that works across a wide range of reference and supply voltages.

BACKGROUND OF THE INVENTION

There is a need for differential buffers that have uniform, symmetrical rise and fall trigger characteristics. Bazes buffers sense both low-to-high and high-to-low transitions equally, symmetrically, and with high speed. However, Bazes buffers tend to consume a lot of current, and also sometimes function inconsistently depending on the reference voltage and Vcc supplied thereto. Therefore, a low-current symmetrical buffer that can work across a wide range of reference and supply voltages is desired.

BRIEF SUMMARY OF THE INVENTION

In one aspect, the invention provides a lower power buffer in which all differential amplifiers contained therein are self-biased. The differential amplifiers can be either fully or half self-biased, where the half self-biased embodiment consumes slightly more power but requires less transistors to create. In another aspect, the buffer is double- rather than single-ended, which provides a more reliable output and aster switching speed. Additional aspects of the present invention locate enable gates at a variety of positions within the buffer.

BRIEF DESCRIPTION OF THE DRAWING

The foregoing and other features and advantages of the invention will become more apparent from the detailed description of the exemplary embodiments of the invention given below in connection with the accompanying drawings in which:

FIG. 7 is an additional schematic diagram of the buffer of FIG. 6, while

FIG. 8 is a schematic diagram of an additional embodiment of the present invention, while

FIG. 9 is a schematic diagram of an additional embodiment of the present invention, while

FIG. 10 is a schematic diagram of an additional embodiment of the present invention, while

FIG. 11 is a schematic diagram of an additional embodiment of the present invention, while

FIG. 12 is a schematic diagram of an additional embodiment of the present invention, while

FIG. 13 is a schematic diagram of an additional embodiment of the present invention, while

FIG. 14 is a schematic diagram of an additional embodiment of the present invention, while

FIG. 15 is a schematic diagram of an additional embodiment of the present invention, while

DETAILED DESCRIPTION OF THE INVENTION

Differential input buffer circuits are useful in digital circuits for determining whether an unknown input voltage. $V_{IN}$ is either above or below a fixed reference voltage $V_{REF}$. Specifically, when $V_{IN} > V_{REF}$, a definite output is expected, and when $V_{IN} < V_{REF}$, another, opposite output is expected. However, to guarantee that the differential input buffer circuit works properly, $V_{IN}$ must differ from $V_{REF}$ by an offset of no less than a predetermined voltage, e.g. 300 mV.

Figure 1:
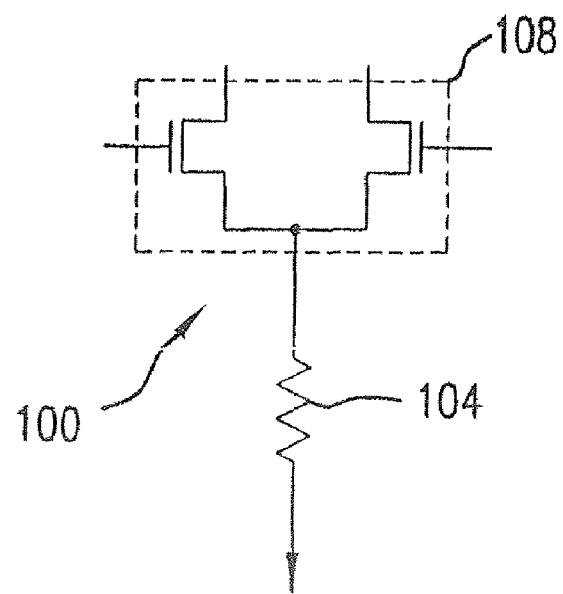
FIG. 1 is a schematic diagram depicting a portion of an input buffer with a resistor bias.

It is a necessary feature of differential buffer circuits to be biased in order that the transistors contained or known therein will be in operational mode at all times. FIG. 1 shows a portion of buffer circuit 100 in which an n-channel differential amplifier 108 is biased using a resistor 104. This arrangement, however, has the disadvantage that it is difficult to consistently fabricate resistors having the exact same resistance vane. Also, the resistance value of resistor 104 may not remain consistent all voltage and temperature ranges during operation, therefore impacting the circuit's bias stability.

Figure 2:
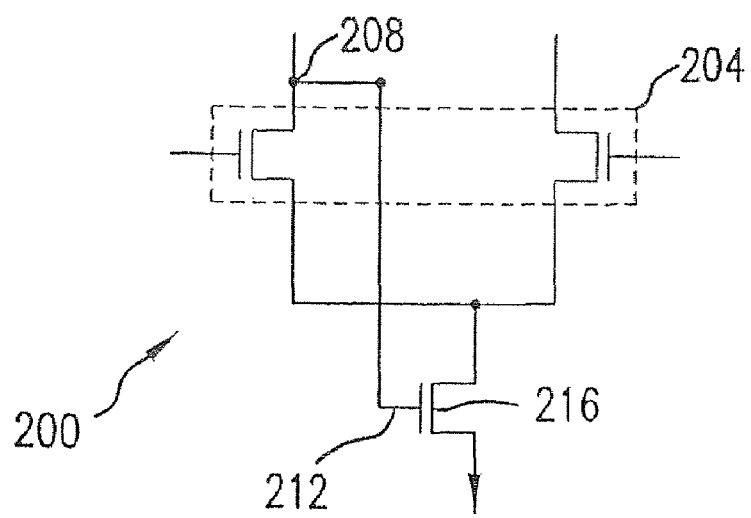
FIG. 2 is a schematic diagram depicting a portion of an input buffer with a self-biasing transistor.

FIG. 2 shows portion of another known buffer circuit 200 which is an improvement over FIG. 1, in that a portion of an input buffer circuit 200 contains an n-channel differential amplifier 204 which is self-biased. As shown in FIG. 2, this self-biasing is accomplished by connecting the source 208 of one of the ndiff transistors (n-channel transistors within a differential amplifier circuit) to the gate 212 of a biasing transistor 216. Thus, improved biasing and switching within a buffer circuit can be achieved.

Figure 3:
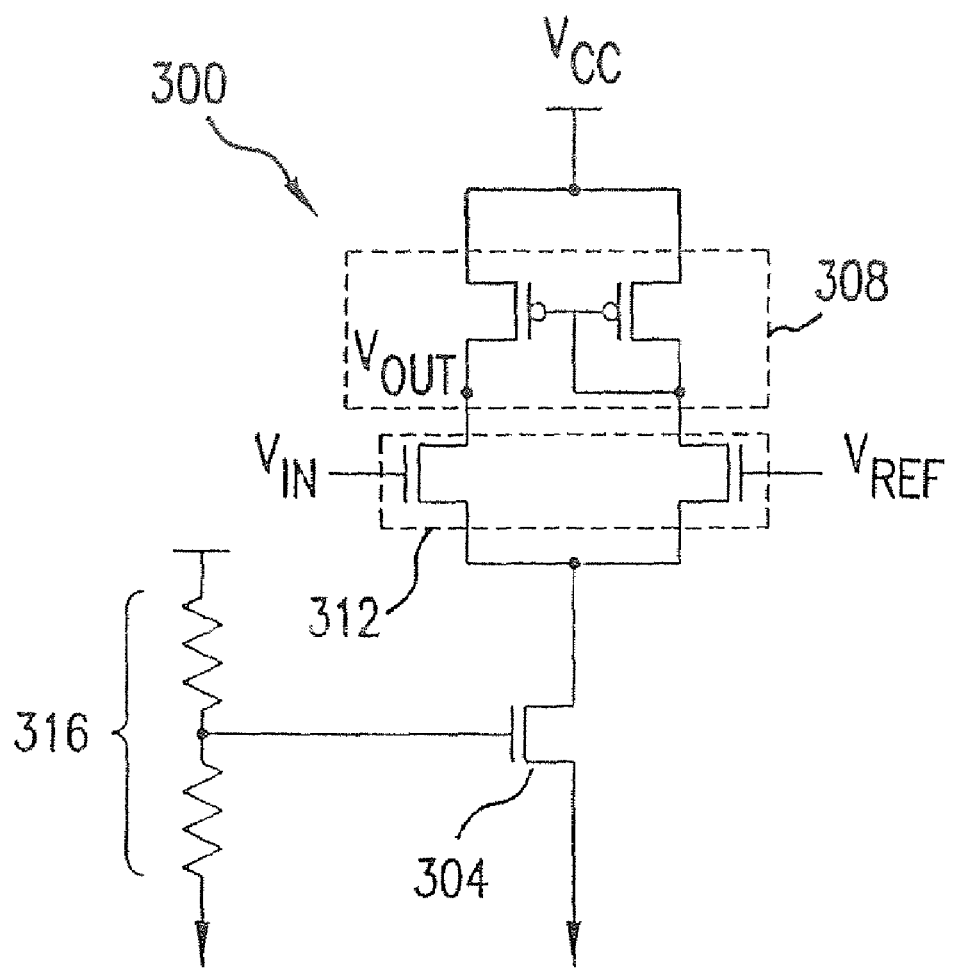
FIG. 3 is a schematic diagram depicting an differential input buffer.

FIG. 3 shows an n-channel differential pair 300, where the current mirror portion 308 ensures that the amount of current through both p-channel transistors is equal. The differential pair 300 is enabled by a biasing transistor 304. Substituting a transistor 304 for the resistor 104 of FIG. 1 stabilizes some of the fabrication problems associated with resistor biasing, but is still tied to an unstable reference resistance tree 316. The circuit 300 also does not operate symmetrically in that it senses low-to-high transitions of $V_{IN}$ differently than it senses high-to-low transitions. This problem is exacerbated when the differential pair 300 is operated across a wide range of reference voltages.

Figure 4:
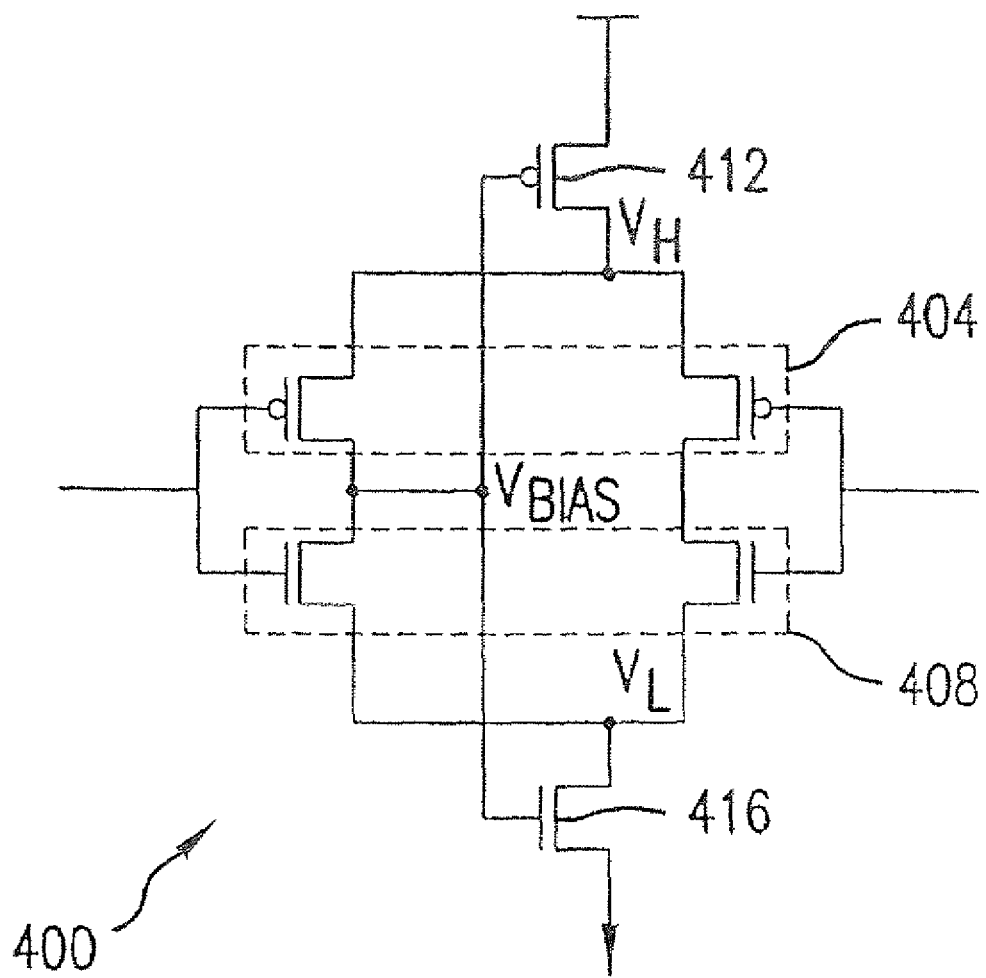
FIG. 4 is a schematic diagram depicting a Bazes buffer.

FIG. 4 is a schematic diagram depicting a Bazes buffer 400 employing a circuit using the self-biasing principles of FIG. 2. As shown in FIG. 4, the gates of p- and n-channel bias transistors 412, 416 are connected at a point between the p- and n-channel differential amplifiers 404, 408. P-channel transistor 412 is connected to Vcc, while n-channel transistor 416 is connected to ground. With this biasing technique, the Bazes buffer 400 responds to inputs in a more symmetrical fashion, but works best when $V_{REF}$ is exactly Vcc/2. As $V_{REF}$ varies from Vcc/2, the symmetry is reduced.

FIG. 4 also shows that the sources of the transistors within the p-channel differential amplifier 404 are connected together at $V_H$, and that the drains of the transistors within the n-channel differential amplifier 408 are connected together at $V_L$. In order for the circuit of FIG. 4 to be biased in a stable fashion, the currents through transistors 412 and 416 steer the current to enable stable switching of the output based on the Vbias level. When Vbias goes higher, the n-channel supplies more current to the ground side. As Vbias goes lower, the p-channels provide more current to the Vcc side. The two bias-voltage inputs are connected to the internal amplifier bias node $V_{BIAS}$. This self-biasing creates a negative-feedback loop that stabilizes the bias voltages. Additionally, any variations in processing parameters or operating conditions that shift the bias voltages away from their nominal values result in a shift in $V_{BIAS}$ which corrects the bias voltages through negative feedback.

In the Bazes buffer of FIG. 4, transistors 412 and 416 operate in the linear region. Consequently, the voltages $V_H$ and $V_L$ may be set very close to the supply voltages. Since these two voltages determine the output swing of the amplifier, the output swing can be very close to the difference between the two supply rails. This large output swing simplifies interfacing the Bazes amplifier to other types of logic gates, since it provides a large margin for variations in the logic threshold of the gates.

Another consequence of the linear range operation of transistors 412 and 416 is that the Bazes amplifier 400 can provide output switching currents which are significantly greater than its quiescent current. In contrast, conventional CMOS differential amplifiers cannot provide switching currents which exceed the quiescent current set by the current-source drive, which operates in the saturation region. This capability of supplying momentarily large current pulses makes the Bazes amplifier especially suitable for high-speed comparator applications where one of the inputs $V_{IN}$ is a reference voltage, and where it is necessary to rapidly charge and discharge output capacitive loads without consuming inordinate amounts of power. Bazes buffers such as that shown in FIG. 4 detect transitions faster, symmetrically, and with less distortion than other buffers. These are very desirable characteristics for high speed data buffers such as input/output buffers for memory devices and processors. Unfortunately, Bazes buffers have the disadvantage that they consume a large amount of current. Also, as VREF moves away from Vcc/2, Bazes buffers lose stability due to current mismatches, because rise and fall times do not track as well as desired.

Figure 5:
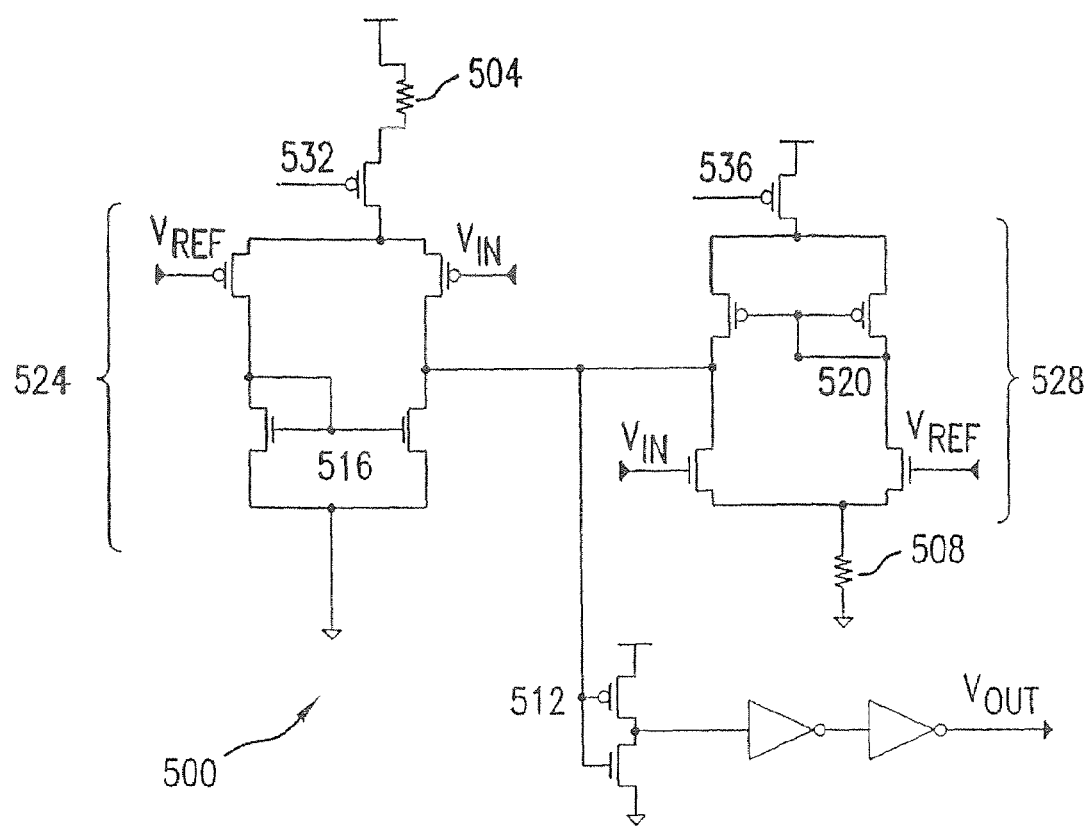
FIG. 5 is a schematic diagram depicting a differential buffer biased using resistors to choke off current.

FIG. 5 shows a known buffer 500. Resistors 504 and 508 assist in achieving bias stability, but as noted with respect to FIG. 1 it is difficult to consistently fabricate resistors having the exact same resistance value. Also, the current supplied though those resistors value may not remain consistent during operation, therefore impacting the circuit's bias stability especially across a range of values for Vcc. Additionally, the buffer 500 still has the problem of consuming excessive amounts of current, as well as inconsistent performance across a range of reference voltages. For example, when $V_{REF}$ is low, the buffer 500 maintains fairly good symmetry but consumes a lot of current. When $V_{REF}=V_{cc}/2$ which is the generally accepted optimum condition of operation, timing data regarding both output conditions is gathered at the output node 512. This data shows that rise time $T_{rise}$ (the result when $V_{IN}>V_{REF}$) is faster than fall time $T_{fall}$ (the result when $V_{IN}<V_{REF}$), which causes the buffer 500 to behave asymmetrically. Finally, as $V_{REF}$ increases, the buffer 500 continues to have its bias nodes 516, 520 go lower, yet the output node 512 stays very dose to ground. This results in the drive ratios of the combined differential amplifiers 524 and 528 becoming skewed so that the buffer ceases to switch well, because $T_{fall}$ increases while $T_{rise}$ decreases. Accordingly, the response again becomes asymmetrical. Even worse, as $V_{REF}$ continues to increase, the P-channel amplification characteristics become so strong that the buffer ceases to work at all. Thus, the drive ratios necessary to make the buffer work well at the lower $V_{REF}$s inhibit the buffer's performance at the higher $V_{REF}$s.

Figure 6:
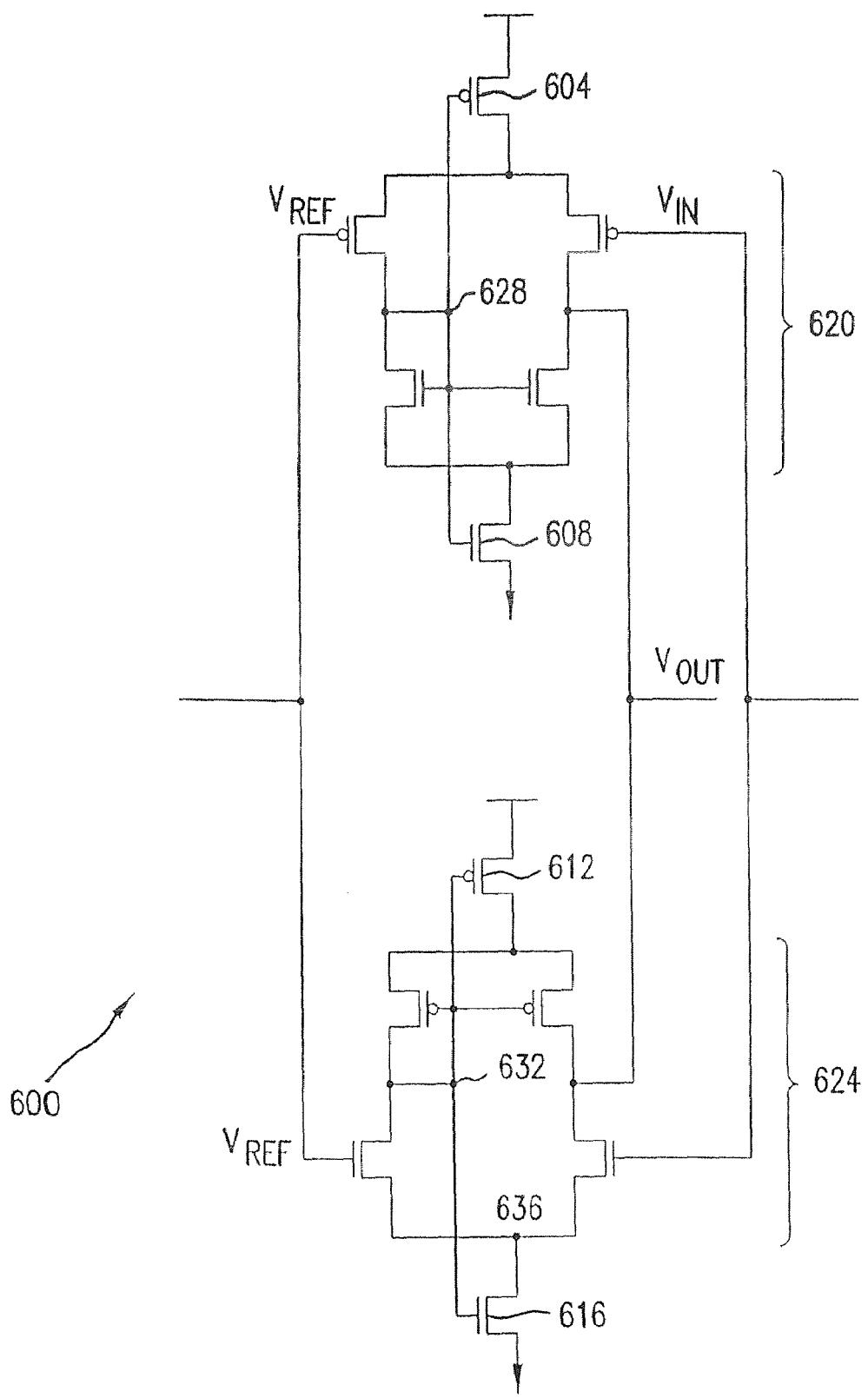
FIG. 6 is a schematic diagram depicting a buffer according to a first embodiment of the present invention.

These problems are mitigated by the input buffers of the present invention as shown in the following Figures. In FIG. 6, the input buffer 600 has two transistors 604, 608 for the p-differential amplifier 620, and two other transistors 612, 616 for the n-differential amplifier 624. The transistors 604, 608, 612, and 616 are included specifically for the purpose of self-biasing, which provides for more consistent performance across a wide range of reference voltages. These transistors result in both p- and n-differential amplifiers 620, 624 being fully self-biased. In contrast, the known circuit of FIG. 5 shows both p- and n-differential amplifiers 524, 528 not self-biased, but instead being choked by resistors 504 and 508. These current-choking resistors 504, 508 cause the differential amplifiers 524, 528 to consume less current, but do not produce a measurable biasing effect. The advantage of being self-biased is that, as $V_{REF}$ increases, bias nodes 628, 632 stay fairly constant, perhaps increasing slightly. During this time the n-channel node 636 node greatly increases, yet the drive ratios of the p-channel to n-channel amplifiers do not change. It is well known that a p-channel differential amplifier works better at lower reference voltages, while n-channel differential amplifiers work better at higher reference voltages. The present invention combines these two characteristics while minimizing the disadvantages associated therewith. This enables the buffers of the present invention, including all of the following embodiments, to work with either synchronous dynamic random access memory (SDRAM), double data rate random access memory (DDRRAM), and low power mobile random access memory (LPMRAM), all of which require differing reference voltages.

Figure 7:
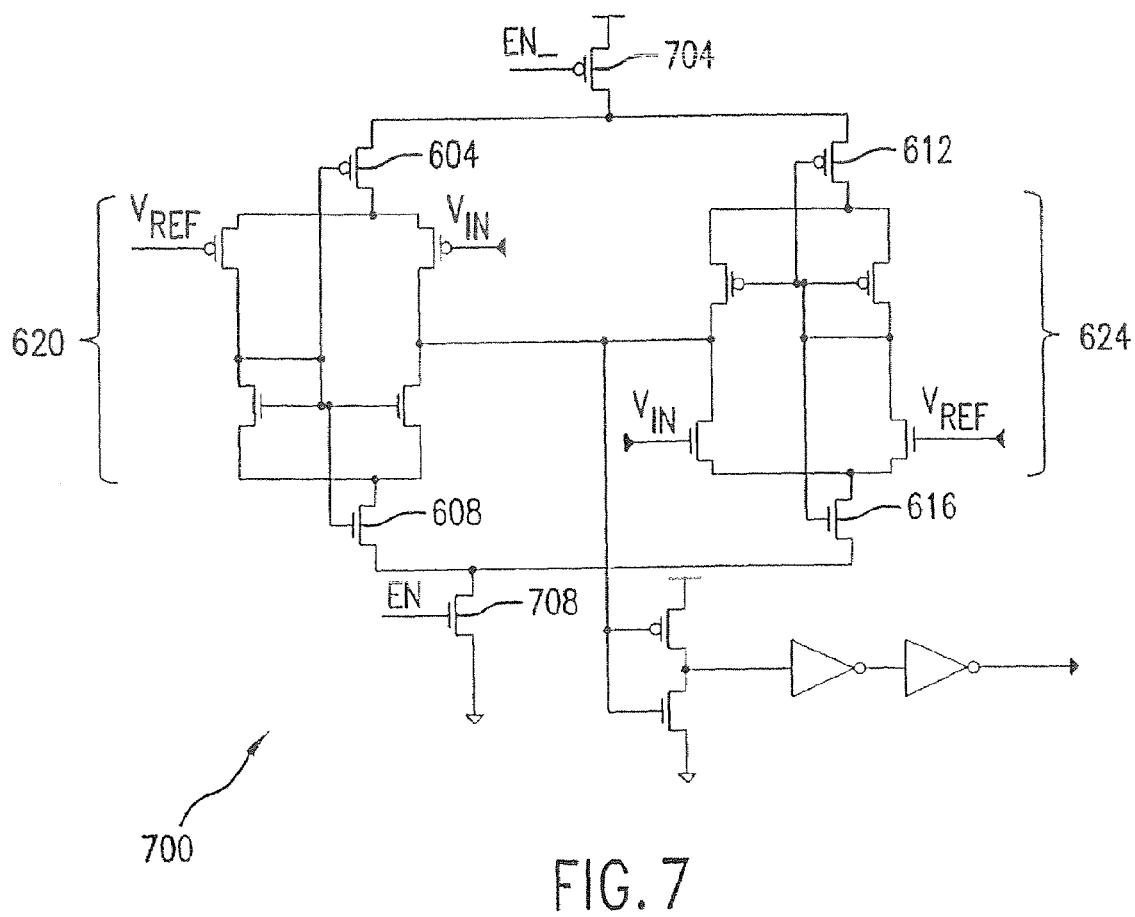

FIG. 7 shows the circuit of FIG. 6 reworked to fit horizontally on a page rather than vertically, and also with the addition of "enable gate" transistors 704 and 708. The enable gate transistor 704 couples biasing transistor 604 and 612 to VCC, while enable gate transistor 708 couples biasing transistor 608 and 616 to ground. Enable gates allow input buffer such as the buffer 600 and 700 to be disabled to save current in certain operating modes. Various embodiments of the present invention will be shown in which portions of the n- and p-channel differential amplifiers either share enable gates or have their own enable gates. Sharing enable gates allow the buffers to consume less current and assist the bias node in tracking variances in the reference voltage $V_{REF}$ and then making any necessary drive ratio adjustments resulting from those variances, thereby resulting in more consistent rise and fall times. The buffer of FIG. 7 works reliably with an input voltage $V_{IN}$ and a reference voltage $V_{REF}$, but also can work with complementary $V_{IN}$ and $V_{IN-}$ inputs.

Additionally, it is important to note that all of the following embodiments have the output side of the buffer is tied to the side of the differential pair that is close to the input signal $V_{IN}$, not the reference signal $V_{REF}$. In this way, the output of the buffer is always inverting. However, the present invention could also be arranged to have the output side of the buffer tied to the side of the differential pair that is close to the reference signal $V_{REF}$, not the input signal $V_{IN}$. This arrangement would always be noninverting.

Additional variations of the FIG. 7 circuit contemplated by the invention include replacing one of the two biasing transistors 604 and 608 with a direct connection between buffer 620 and transistor 704 and buffer 620 and enable gate 708 respectively, which would then make the p-differential amplifier 620 only half self-biased, while the n-differential amplifier 624 remains fully self-biased. Similarly, one of the two biasing transistors 612 and 616 could also be replaced with a direct connection between amplifier 624 and either enable gate 704 or 708, which would then make the n-differential amplifier 624 only half self-biased, while the p-differential amplifier 620 would remain fully self-biased.

Figure 7A:
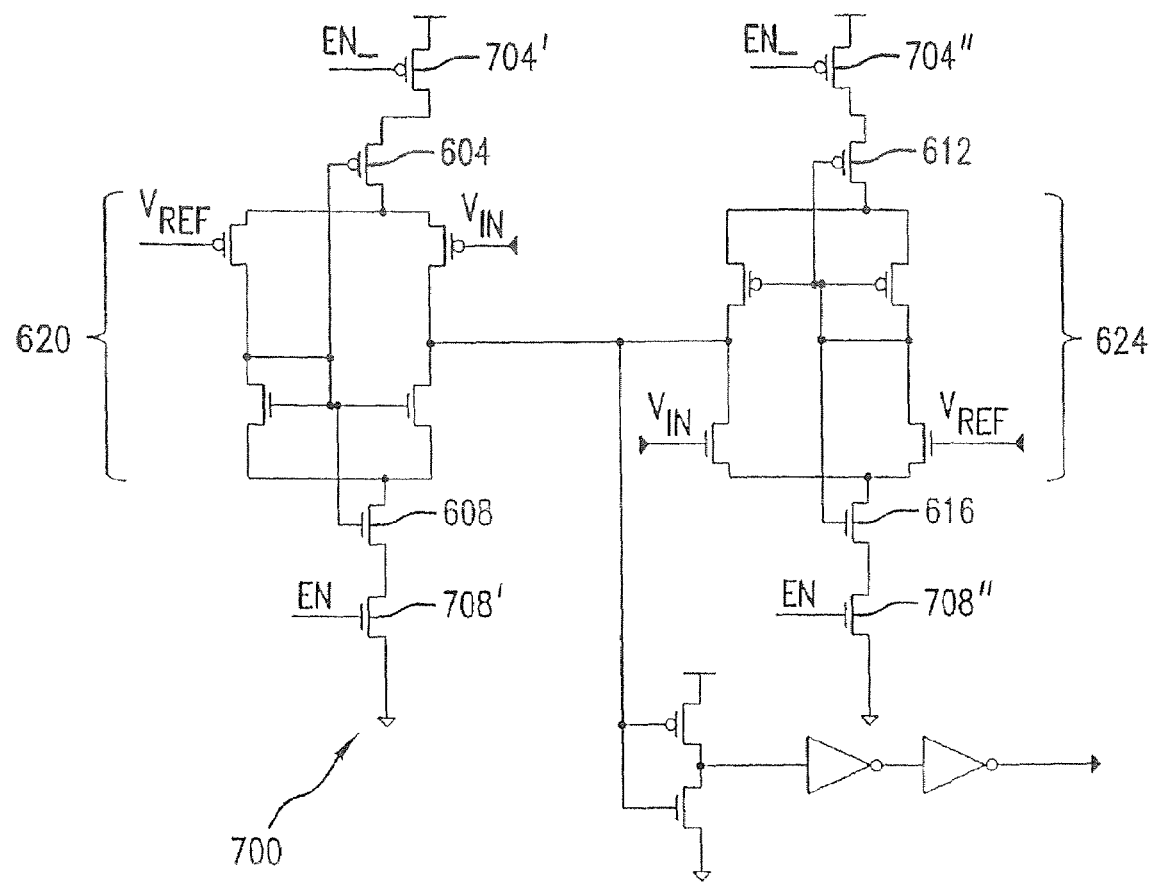
FIGS. 7A, 7B, 7C, 7D, and 7E show variations of the buffer of FIG. 7.

FIG. 7 shows both p- and n-differential amplifiers 620, 624 respectively sharing enable gates 704 and 708. However, each differential amplifier could have its own enable gate 704' or 708' (for p-differential amplifier 620) and 704", 708" (for n-differential amplifier 624), as shown in FIG. 7A. Additionally, each differential amplifier 620, 624 could share one enable gate 704 as in FIG. 7, but also have separate enable gates 708', 708" instead of enable gate 708 as in FIG. 7A, or vice versa.

Figure 7B:
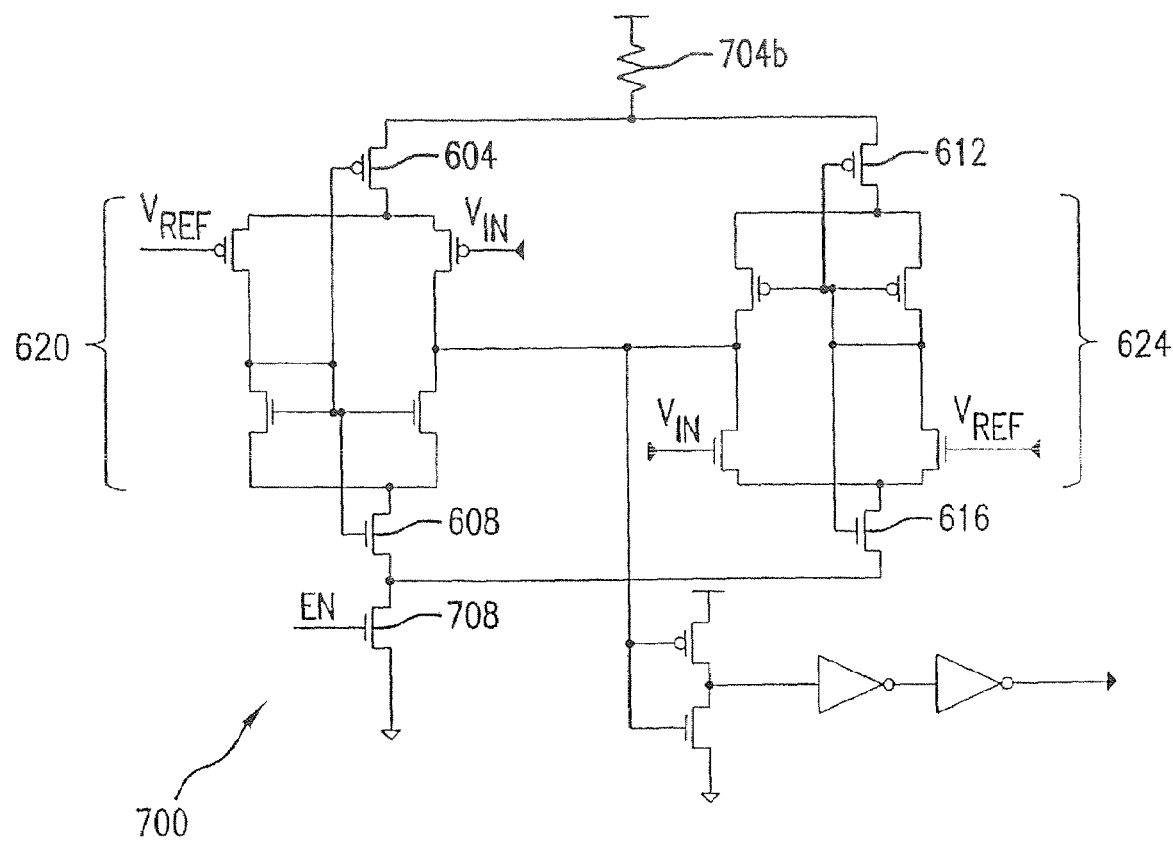
Figure 7C:
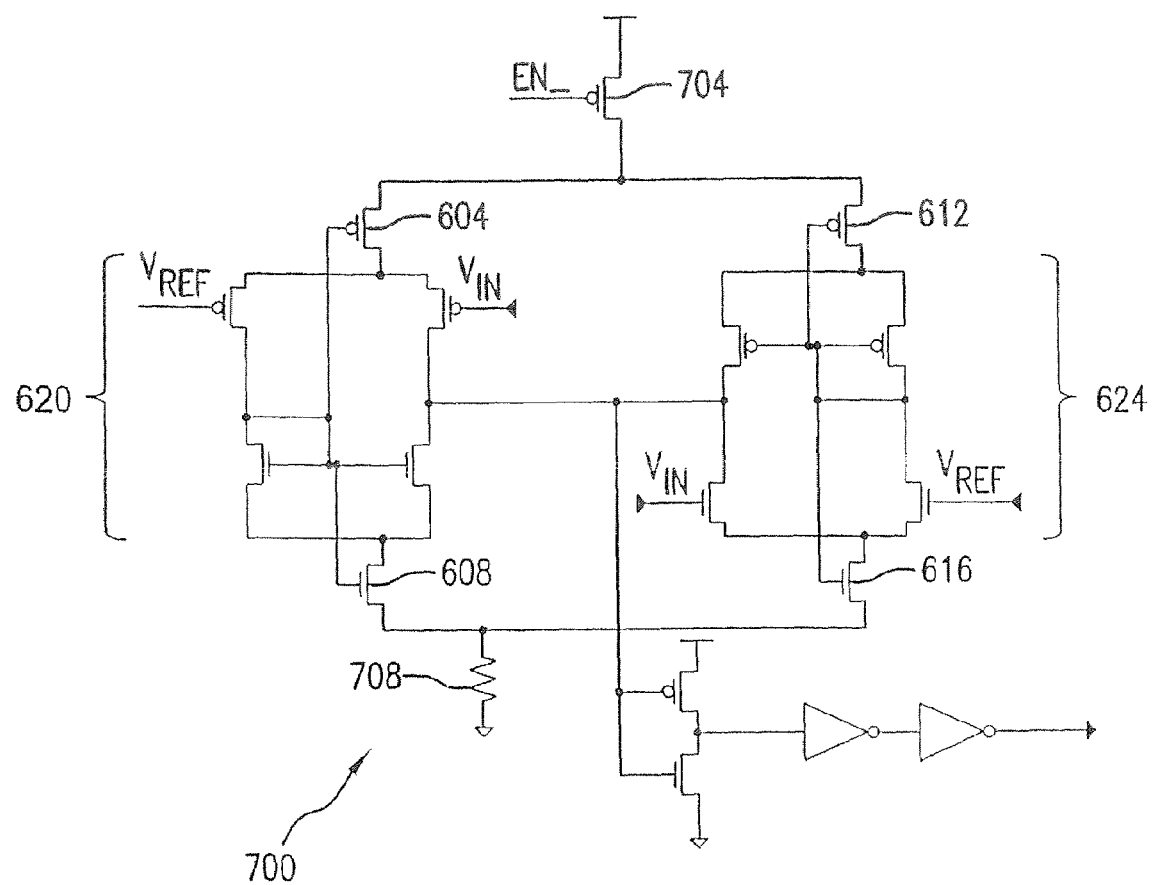
Figure 7D:
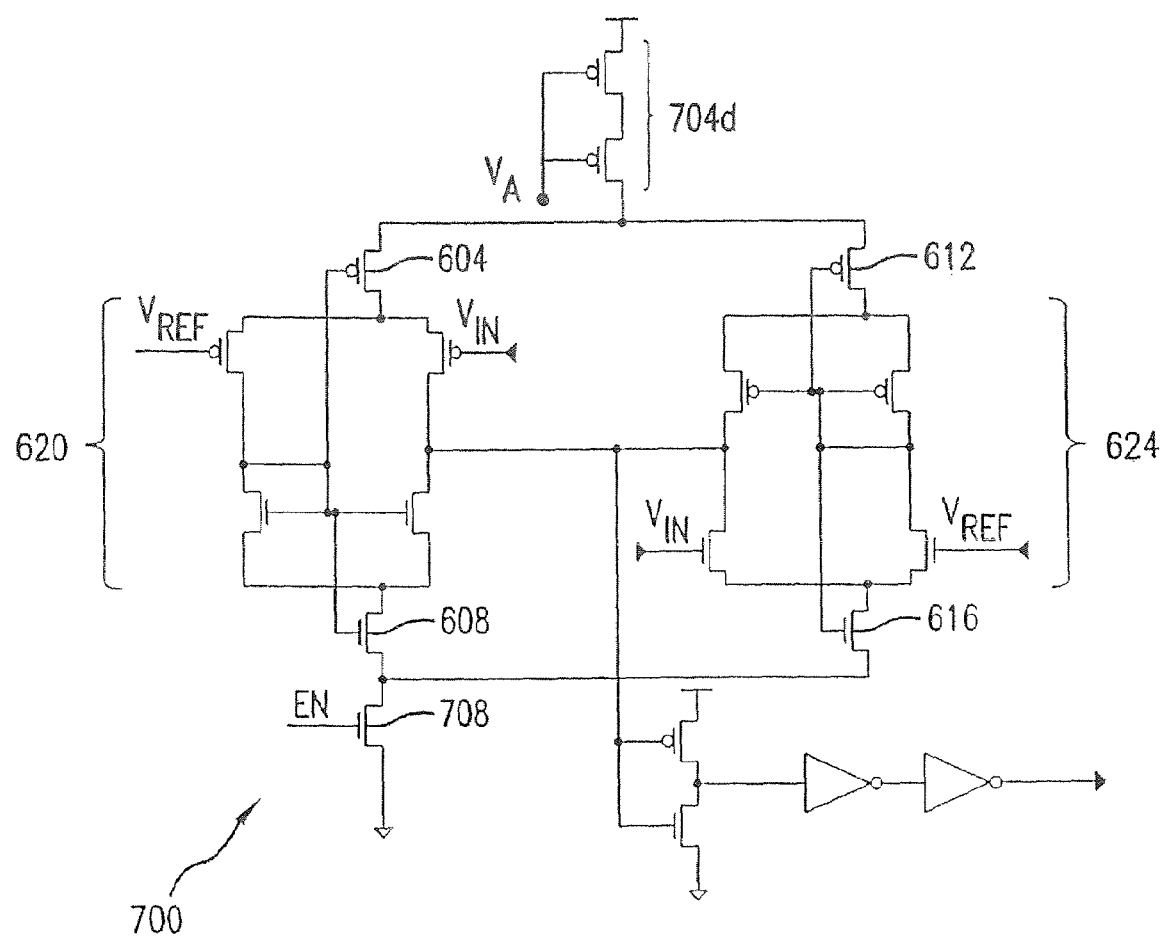
Figure 7E:
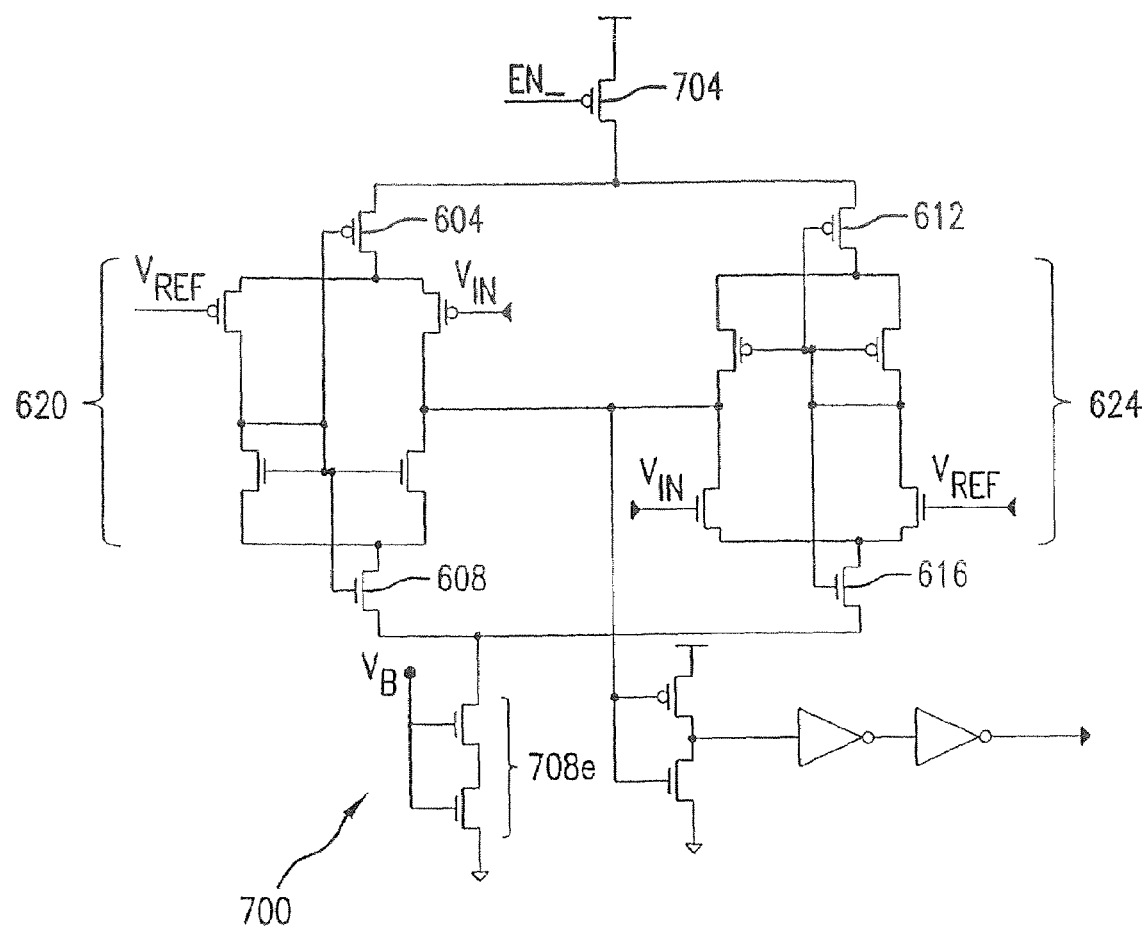

As another variation to the FIG. 7 circuit, one of the enable gates 704, 708 but not both could be replaced by a resistor 704b or 708c, as shown in FIGS. 7B and 7C. Furthermore, either enable gate 704 or 708 of FIG. 7 could be replaced by series transistors. In the case where the enable gate 704 is replaced by p-channel series transistors, the transistors would have their gates tied to $V_A$ as shown in FIG. 7D, where ground $<=V_A<V_{TP}$ (threshold voltage of the p-channel transistors). In the case where the enable gate 708 is replaced by n-channel series transistors, the transistors would have their gates tied to $V_B$ as shown in FIG. 7E, where threshold voltage of the n-channel transistors $V_{TN}<V_B<=Vcc$.

Figure 8:
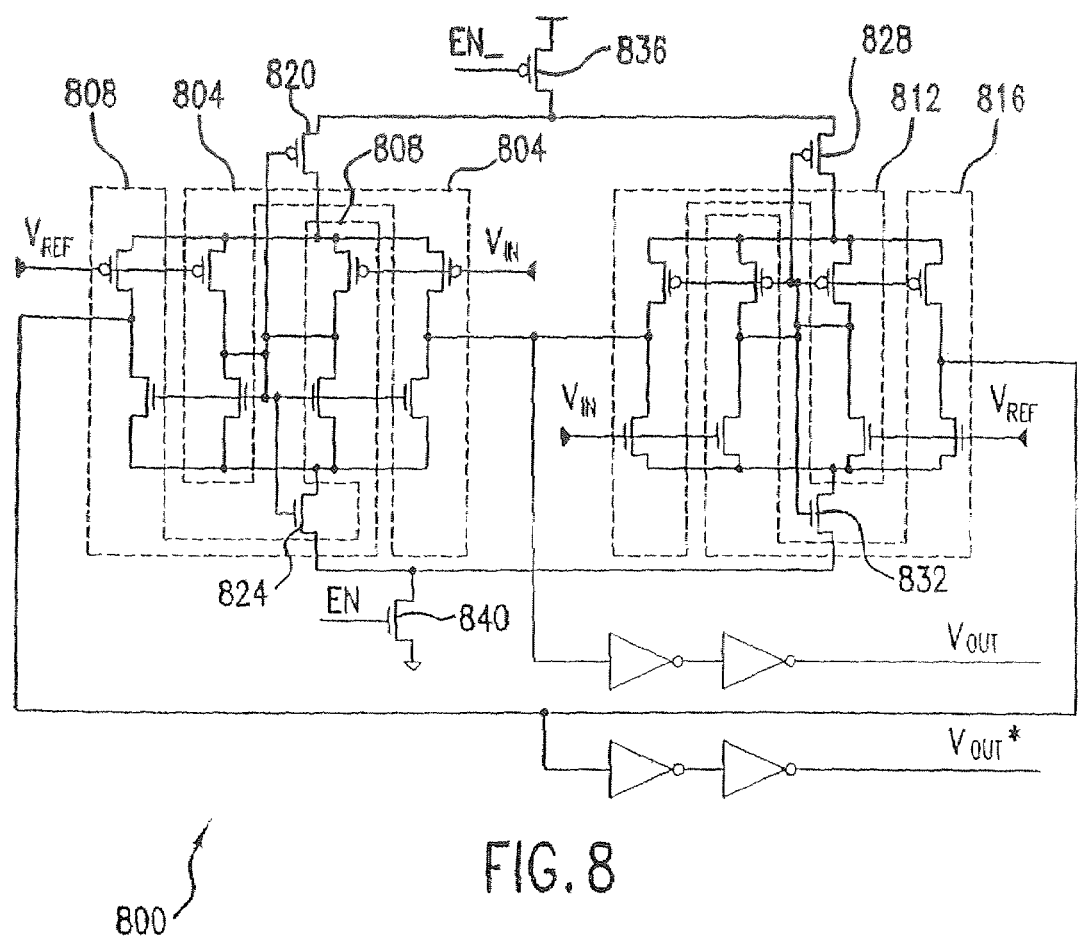

Another embodiment of the present invention is shown in FIG. 8, in which a differentially folded input buffer 800 has mirrored p-differential amplifiers 804, 808, as well as mirrored n-differential amplifiers 812, 816. As shown in FIG. 8, the outputs of differential amplifiers 804 and 812 are combined, and the outputs of differential amplifiers 808 and 816 are combined. The amplifiers 804, 812 are coupled to provide the differential output $V_{OUT}$, while the amplifiers 808, 816 are combined to provide the complementary signal $V_{OUT^-}$. The FIG. 8 circuit is advantageous for improving reliability and accuracy of the two output signals, and also for creating two complementary outputs as opposed to a single ended output.

The FIG. 8 embodiment has the differential amplifiers 804, 808 fully self-biased by transistors 820, 824, and the differential amplifiers 812, 816 fully self-biased by the transistors 828 and 832. FIG. 8 also has enable gates 836 and 840, which couple bias transistors 820 and 828 to Vcc and bias transistors 824, 832 to ground, respectively.

Variations of the FIG. 8 circuit which also form part of the invention include replacing either one of the two biasing transistors 820 and 824 with a direct connection to enable gate 836 or 840, which would then make the mirrored p-differential amplifiers 804, 808 only half self-biased, while the mirrored n-differential amplifiers 812, 816 would remain fully self-biased. Similarly, one of the two biasing transistors 828 and 832 could also be replaced with a direct connection to enable gate transistor 836 or enable transistor 840, which would then make the mirrored n-differential amplifiers 828, 832 only half self-biased, while the mirrored p-differential amplifiers 820, 824 would remain fully self-biased.

Figure 8A:
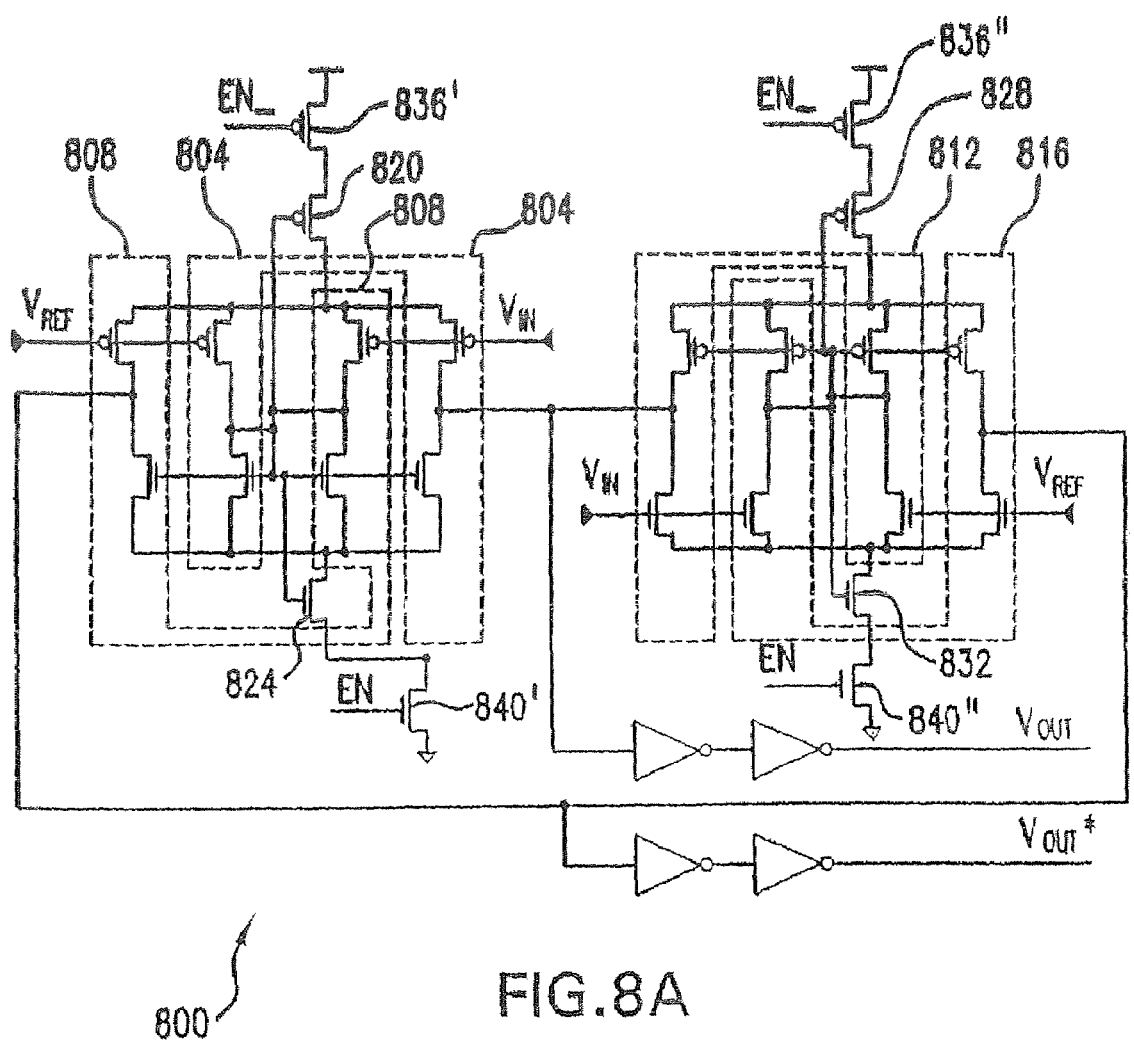
FIGS. 8A, 8B, 8C, 8D, and 8E show variations of that embodiment.
Figure 8B:
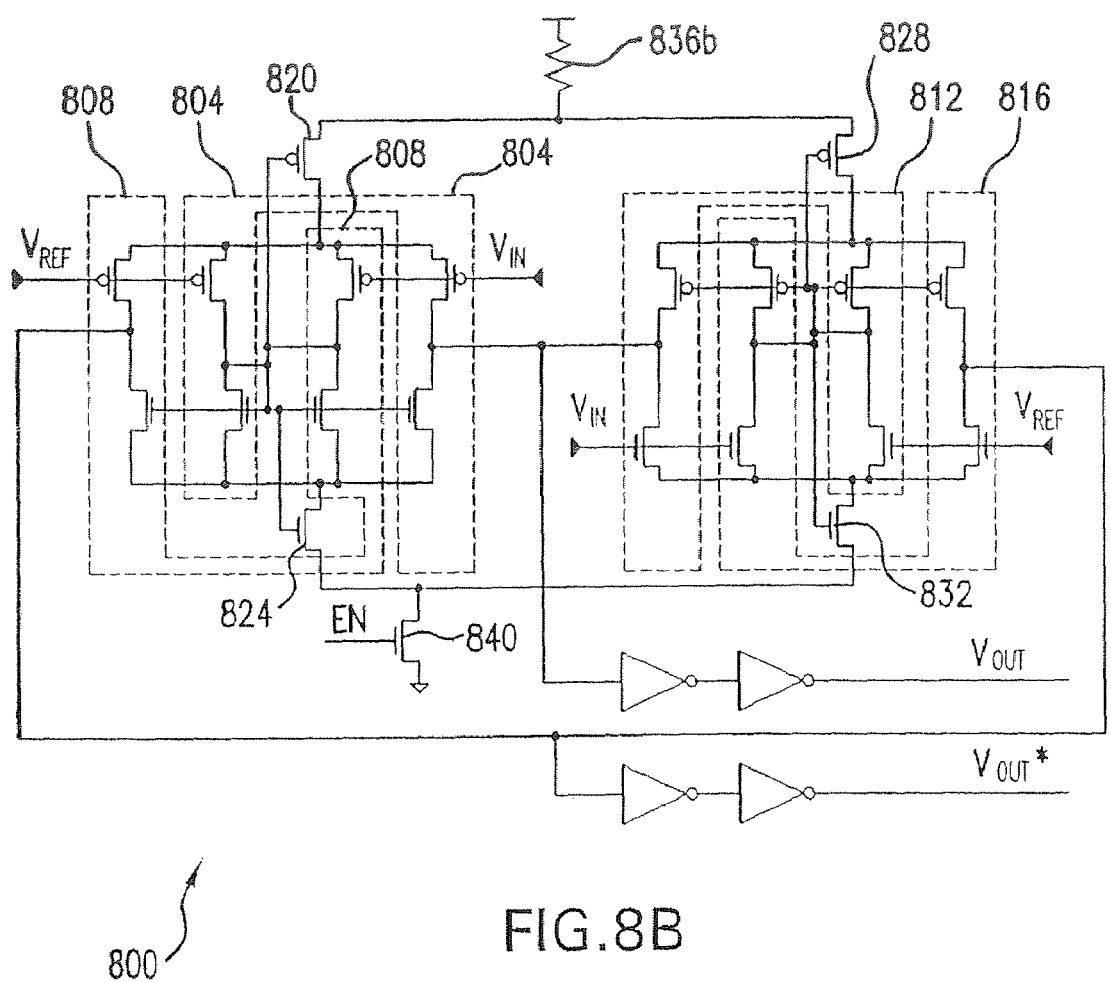
Figure 8C:
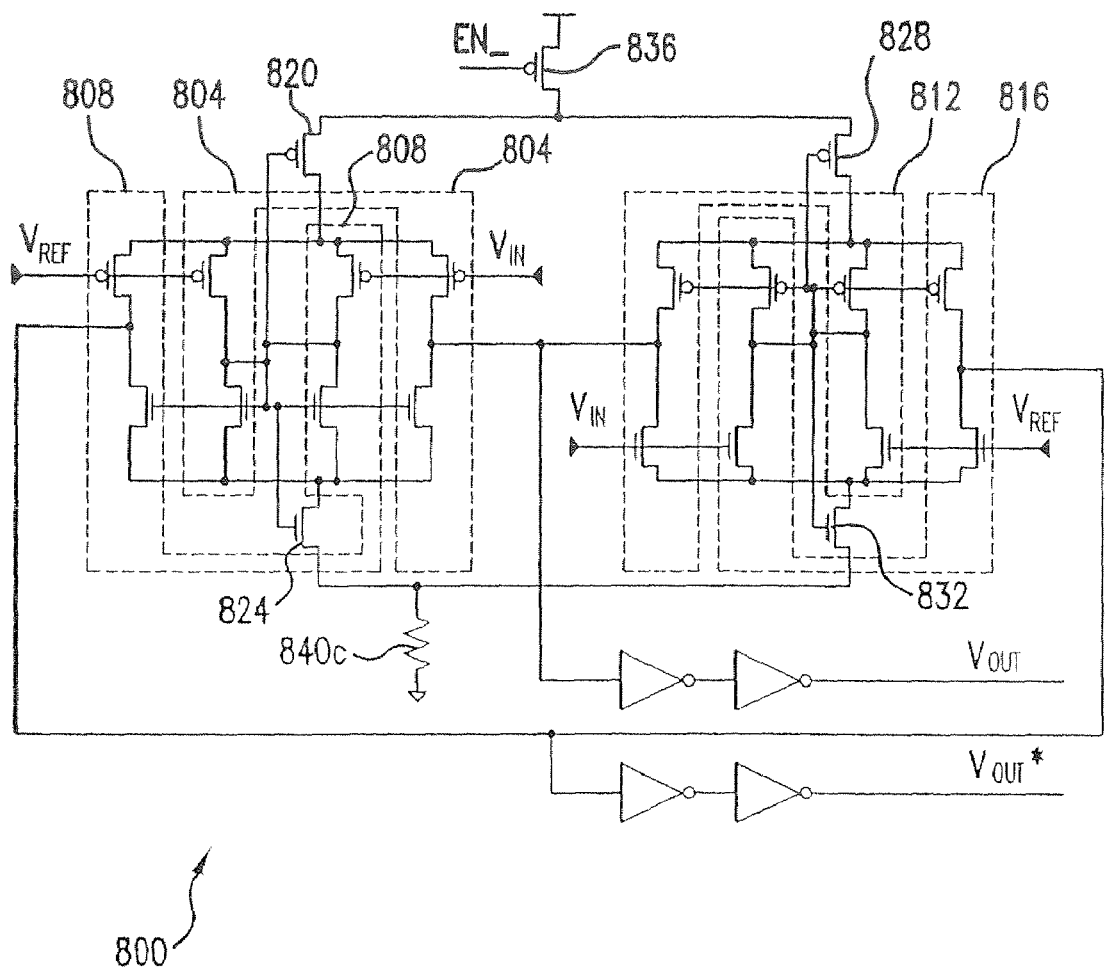
Figure 8D:
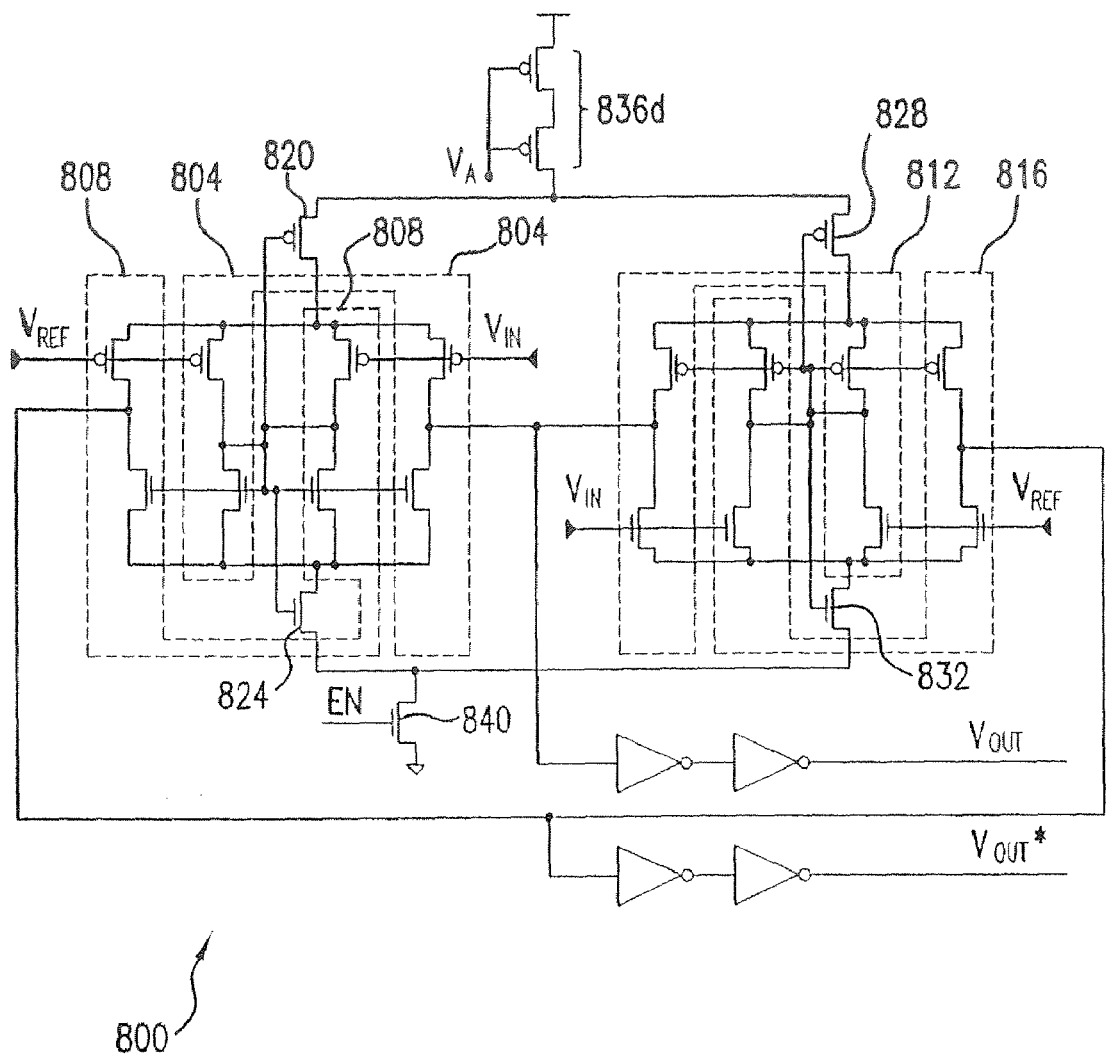
Figure 8E:
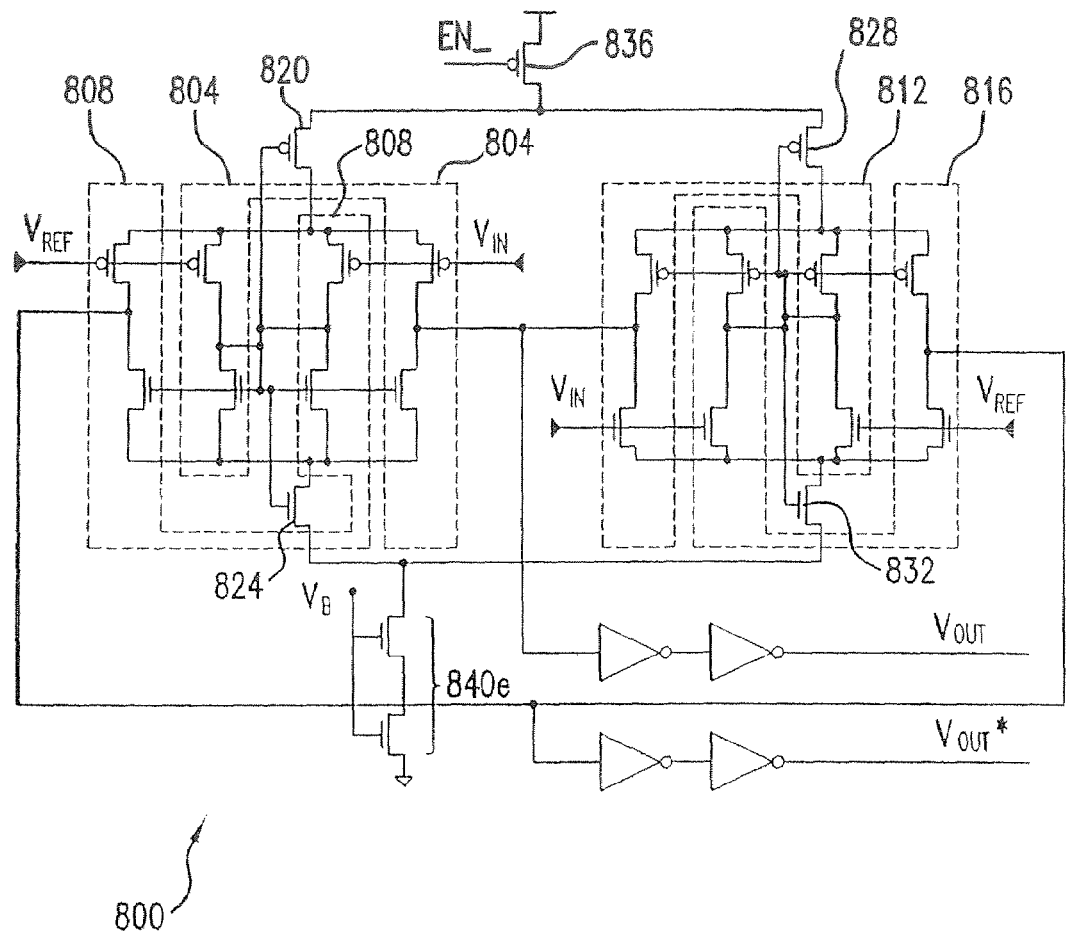

FIG. 8 shows all mirrored differential amplifiers 804, 808, 812, 816 sharing enable gates 836 and 840. However, each set of 804, 808 mirrored differential amplifiers (804, 808 and 812, 816) could have its own enable gates 836', 840' and 836", 840" as shown in FIG. 8A. Additionally, each mirrored differential amplifier 804, 808, 812, 816 and FIG. 8 could share enable gate 836 as shown in FIG. 8, but have separate enable gates 840', 840" as shown in FIG. 8A instead of enable gate 840, or vice versa.

Furthermore, one but not both of the enable gates 836, 840 of FIG. 8 could be replaced by a resistor 836b, 840c or series transistors 836d, 840e as shown in FIG. 8B-8E. In the case where the enable gate 836 to Vcc of FIG. 8 is replaced by p-channel series transistors 836d (FIG. 8D), the transistors would have their gates tied to $V_A$, where ground $<=V_A<V_{TP}$. In the case where the enable gate 840 to ground of FIG. 8 is replaced by n-channel series transistors 840e (FIG. 8E), the transistors would have their gates tied to $V_B$, where $V_{TN}=V_B<=Vcc$.

Figure 9:
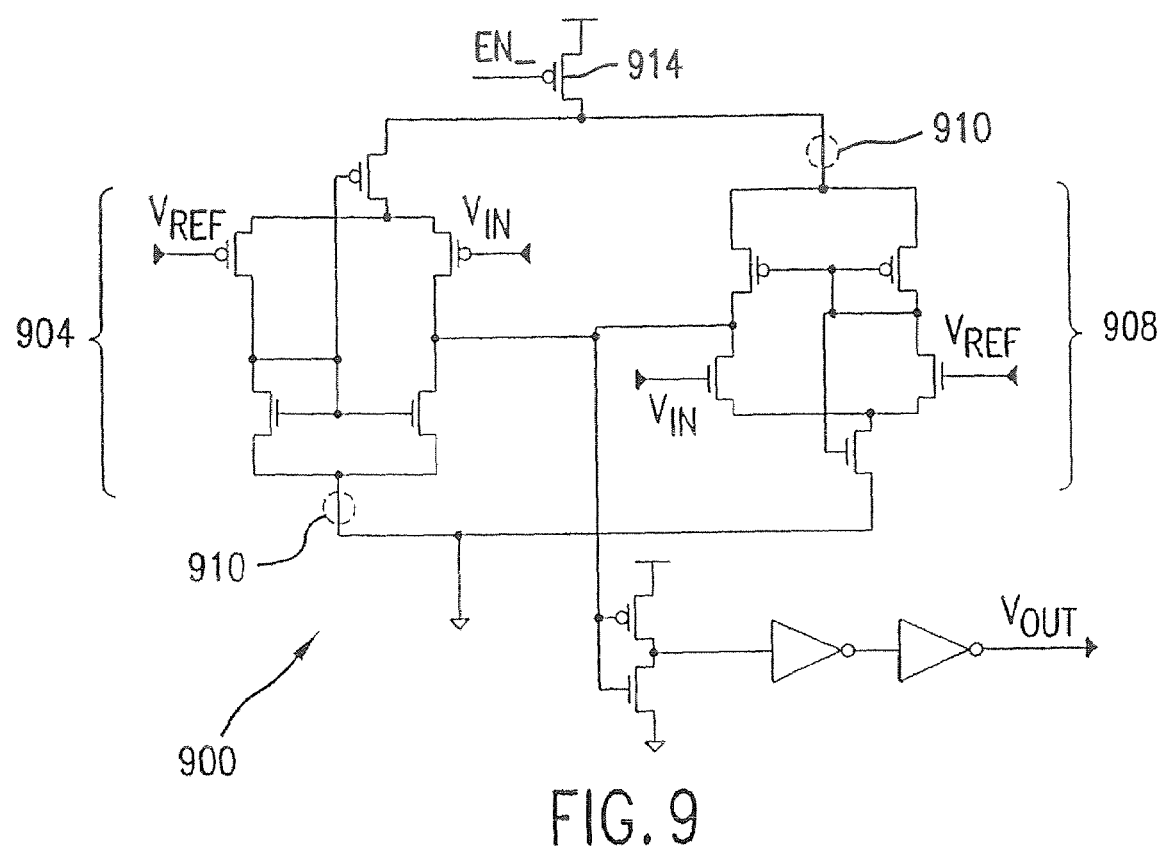

Another embodiment of the present invention is shown in FIG. 9, in which an input buffer 900 has a p-differential amplifier 904 as well as an n-differential amplifier 908. Both amplifiers 904, and 908, however, are only half self-biased, as shown by the dashed circles 909 and 910 which are meant to draw attention to the lack of an electronic component located there. Being half self-biased is advantageous in that fewer transistors are used, but results in slightly higher current consumption. As stated, all of the embodiments of the present invention using half rather than full self-biasing have the disadvantage of slightly higher current consumption. However, response symmetry is not measurably affected by half self-biasing. Both amplifiers 904 and 908 share a p-channel enable gate 914 to Vcc.

Figure 9A:
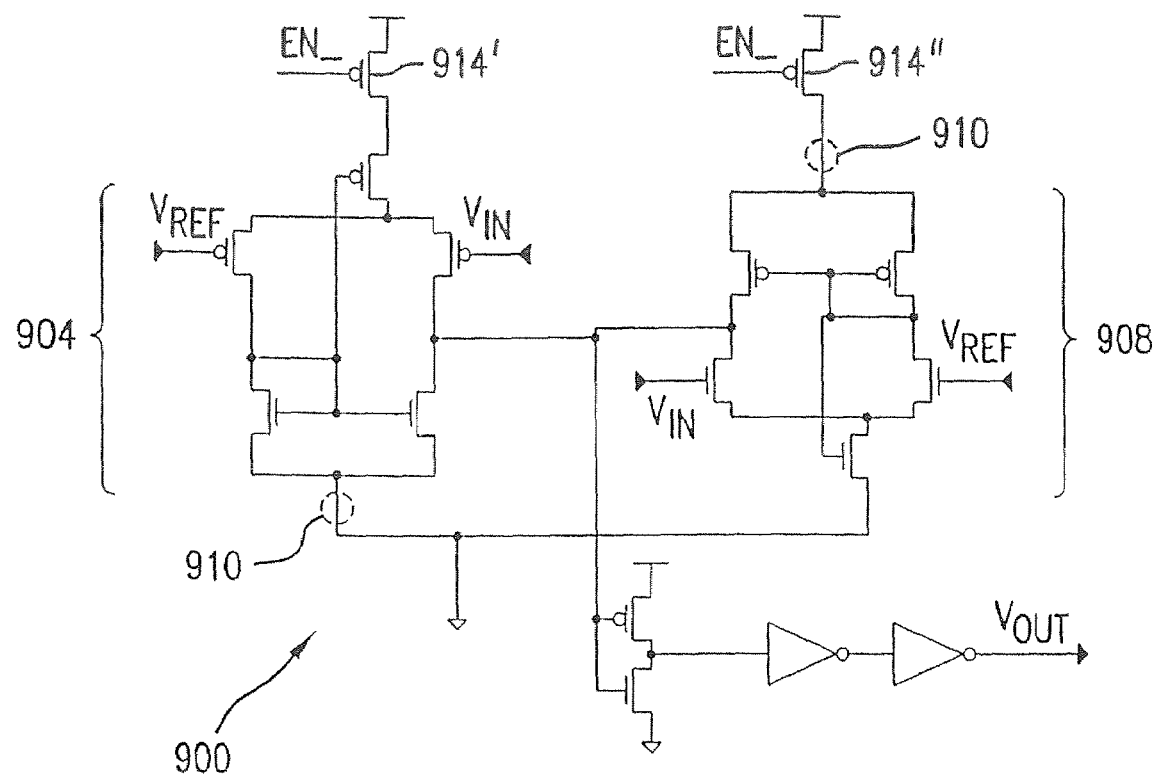
FIGS. 9A, 9B, and 9C show variations of that embodiment.
Figure 9B:
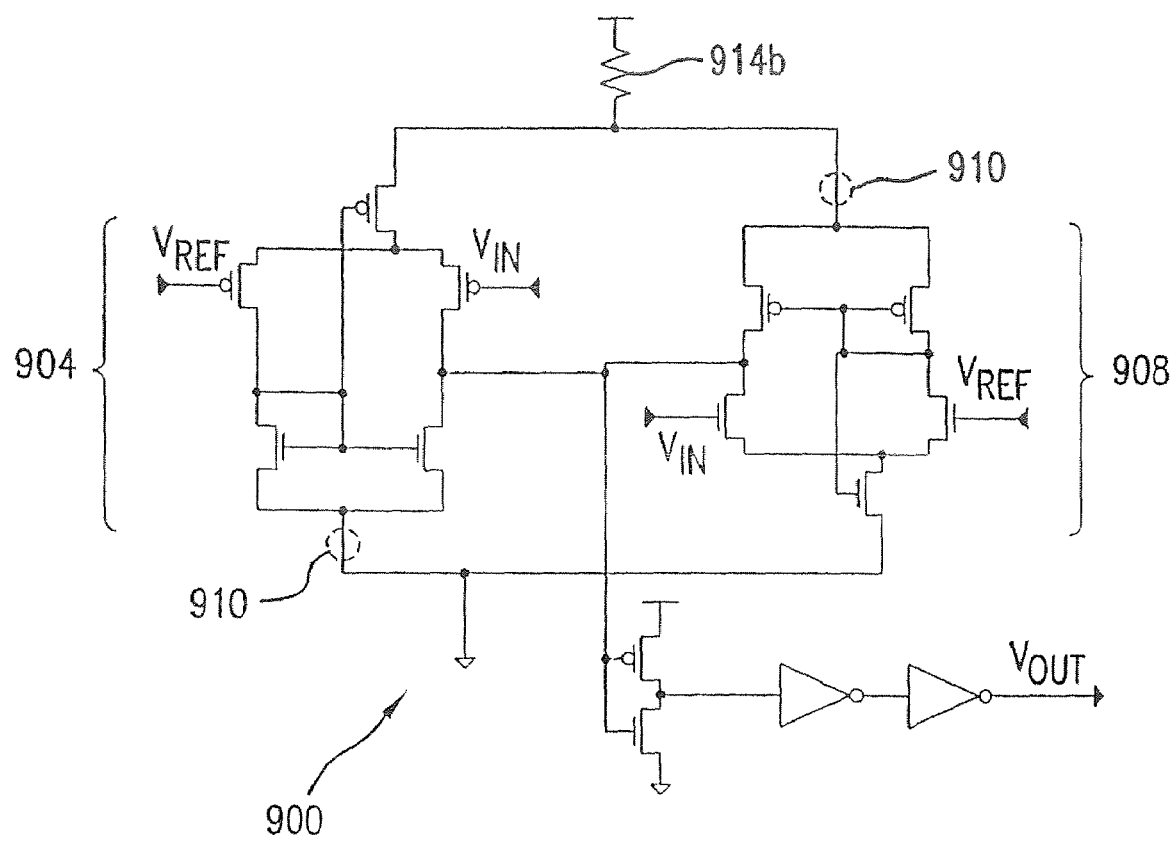
Figure 9C:
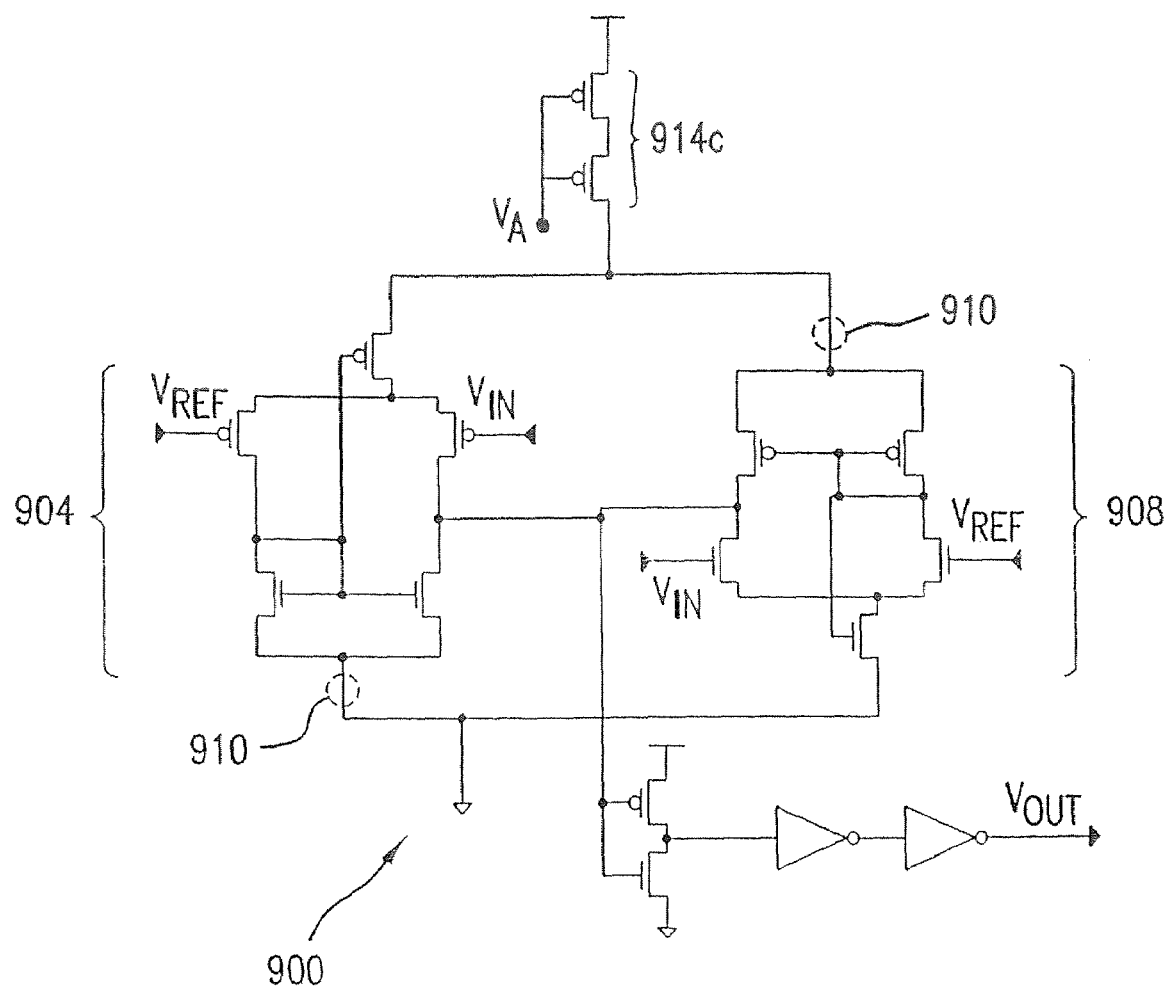

Additional variations of the FIG. 9 embodiment could include each differential amplifier 904 and 908 having its own enable gate 914', 914", as shown in FIG. 9A. Furthermore, the enable gate 914 of FIG. 9 could be replaced by a resistor 914b or series transistors 914c with their gates tied to $V_A$ where ground $<=V_A<V_{TP}$, as shown in FIGS. 9B and 9C, respectively.

Figure 10:
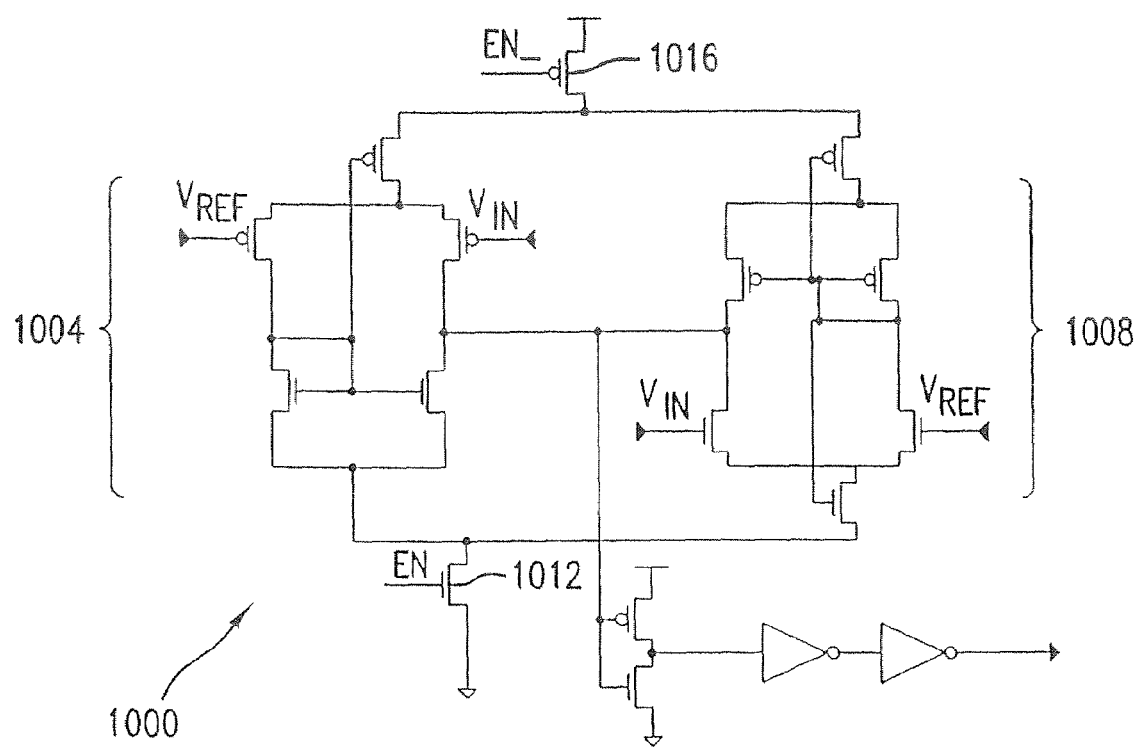

Another embodiment of the present invention is shown in FIG. 10, wherein a p-differential amplifier 1004 is half self-biased, while an n-differential amplifier 1008 is fully self-biased. Both amplifiers 1004 and 1008 share an n-channel enable gate 1012 to ground as well as a p-channel enable gate 1016 to Vcc. This embodiment, like all of the embodiments having half rather than fully self-biasing, has the disadvantage of slightly higher current consumption yet requires less transistors and maintains satisfactory response symmetry.

Figure 10A:
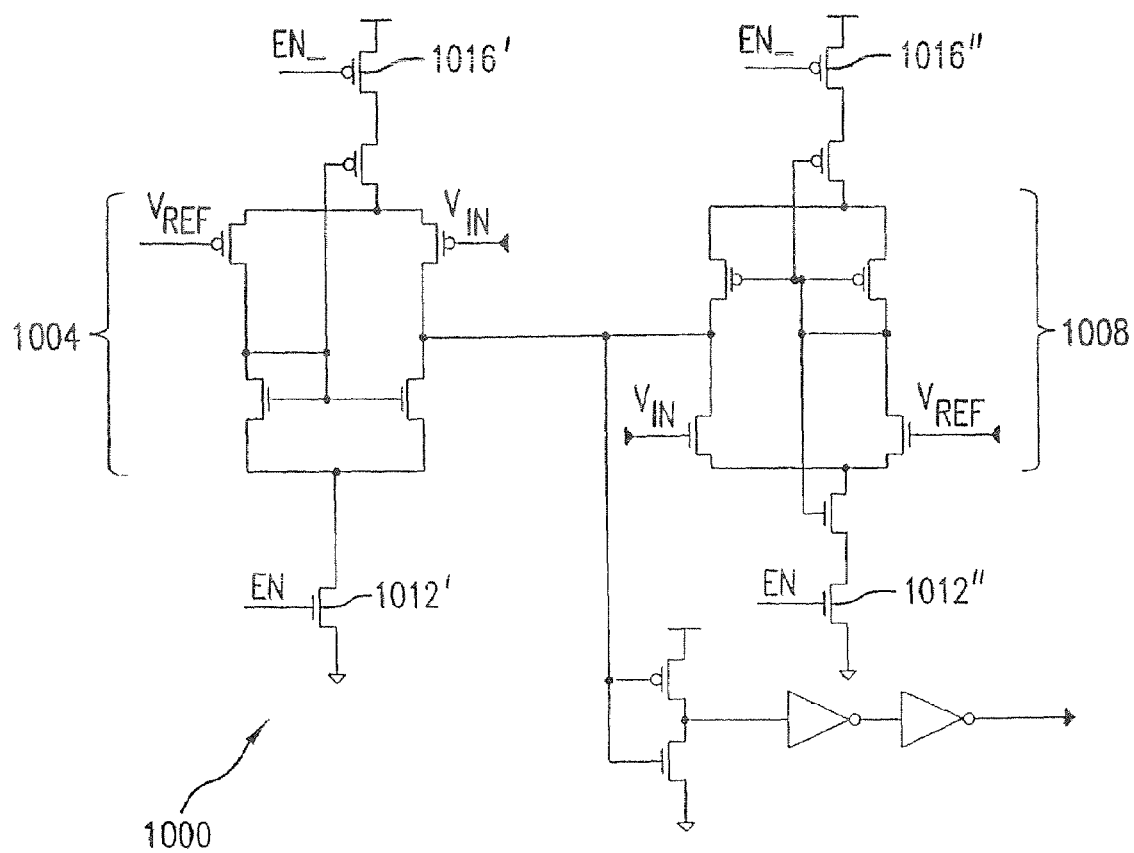
FIGS. 10A, 10B, 10C, 10D, and 10E show variations of that embodiment.
Figure 10B:
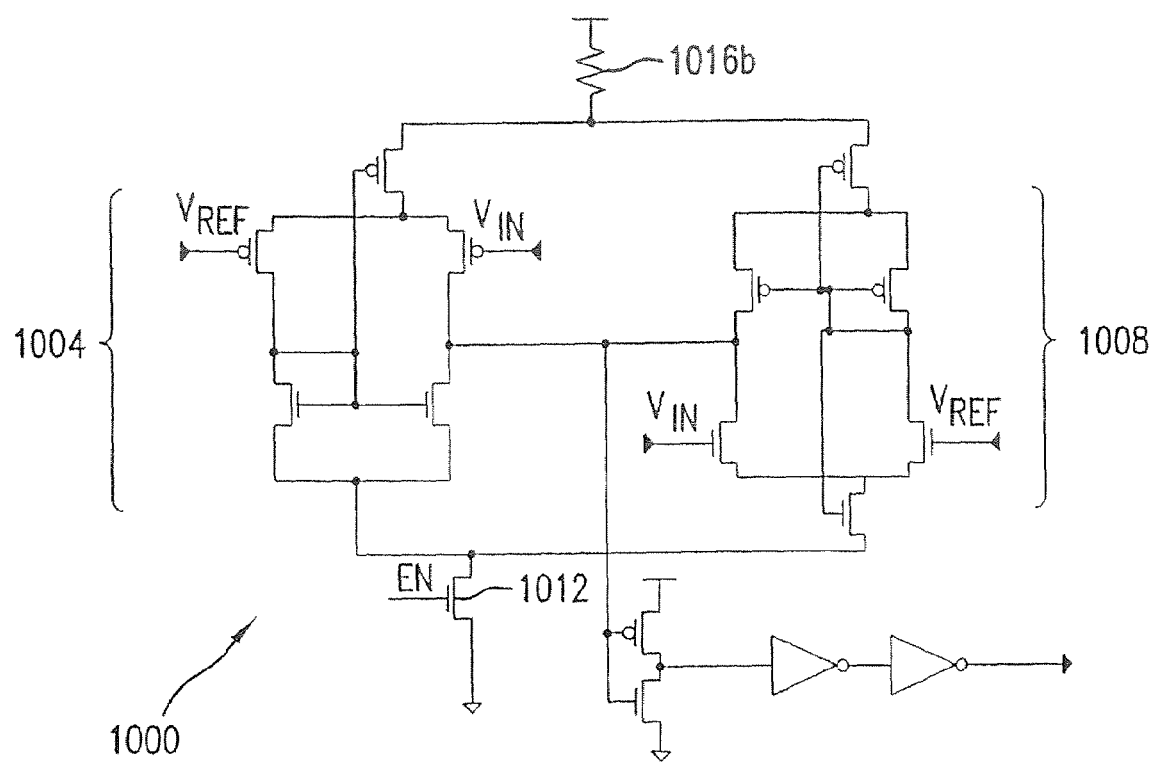
Figure 10C:
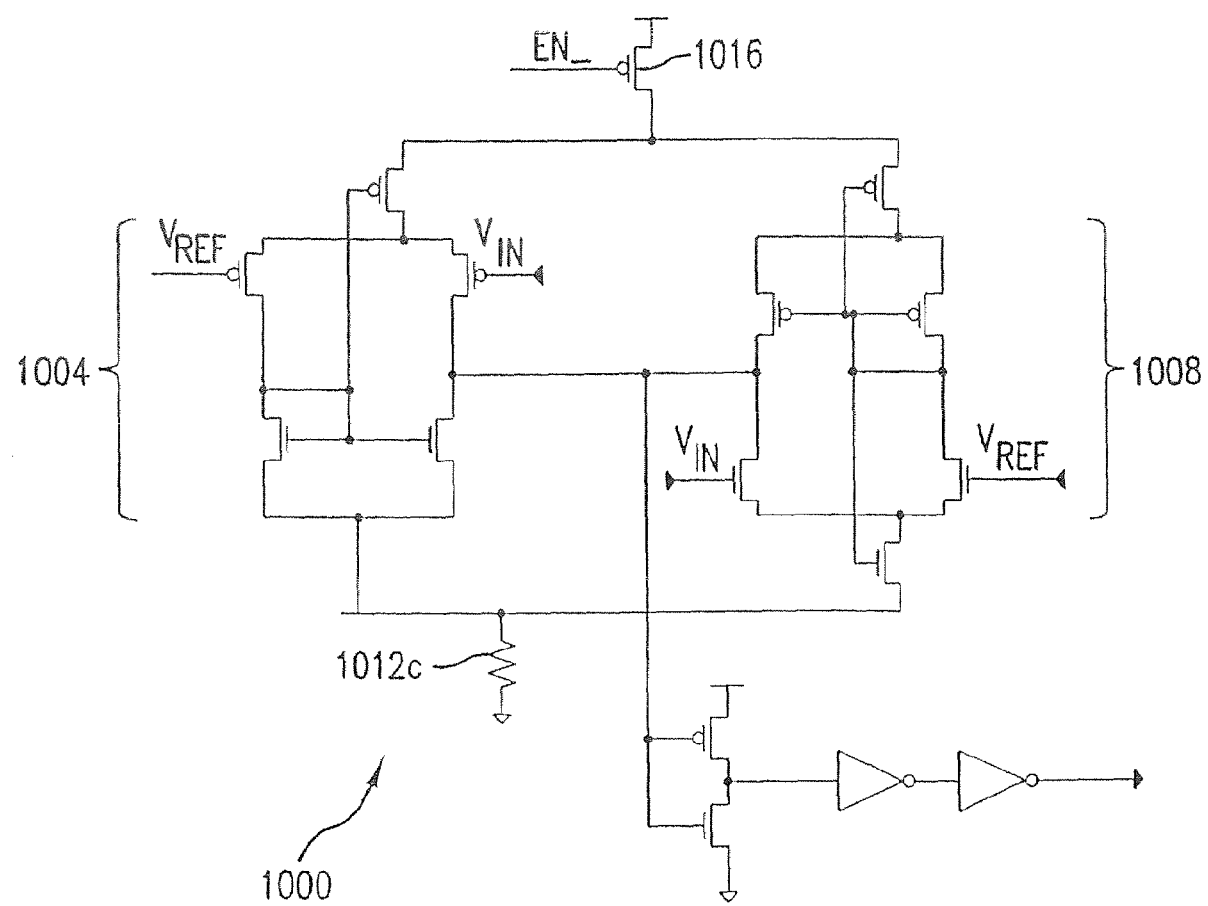
Figure 10D:
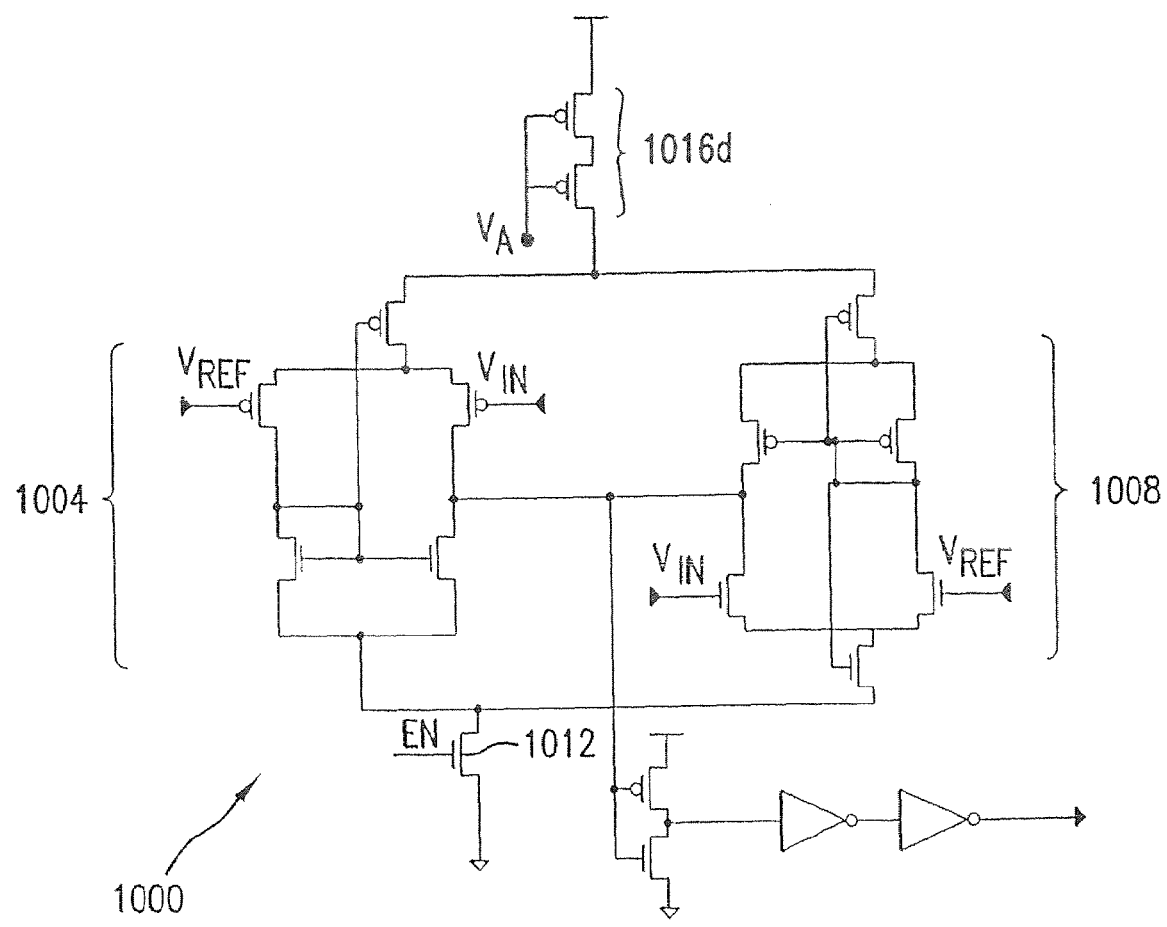
Figure 10E:
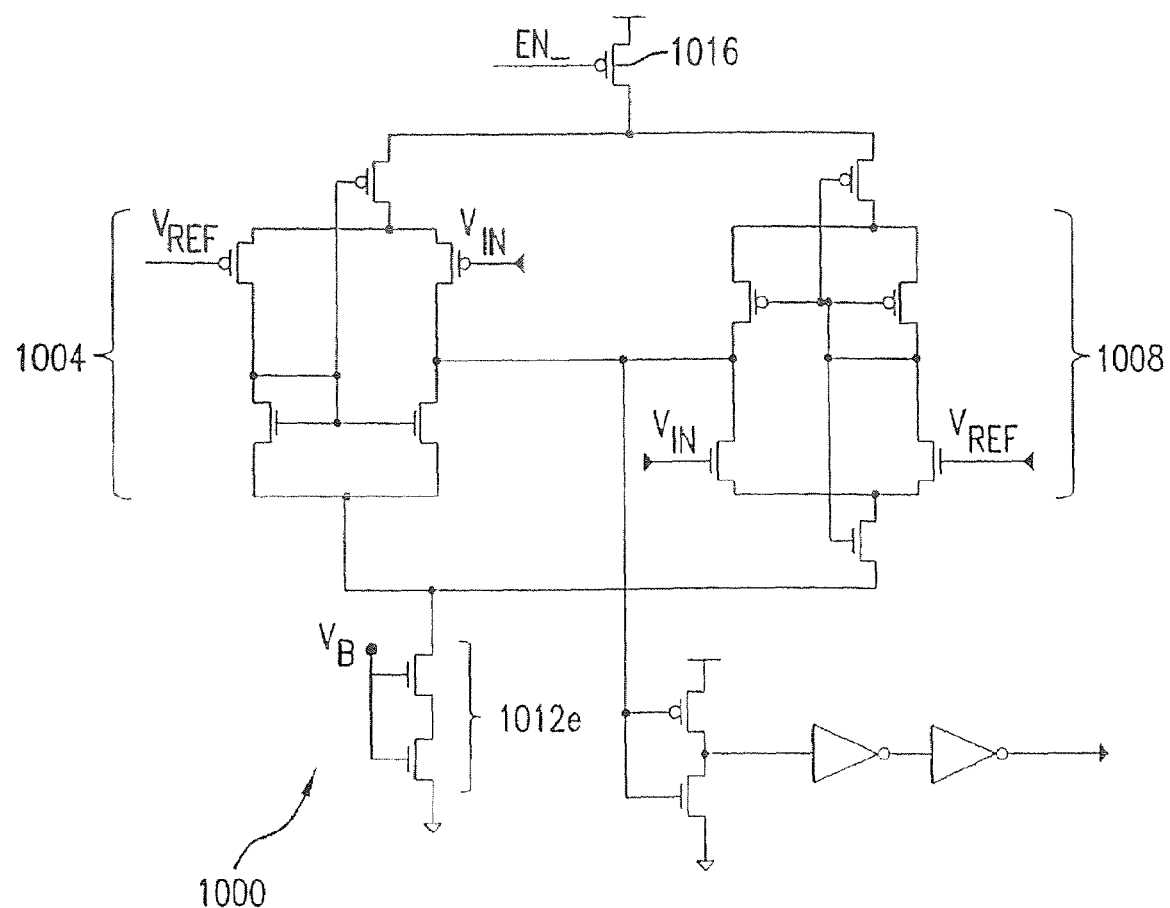

Additional variations of the FIG. 10 embodiment could include each differential amplifier 1004, 1008 having its own enable gates 1016', 1016", 1012', 1012", as shown in FIG. 10A. Additionally, each differential amplifier could share enable gate 1016 as in FIG. 10, but have separate enable gates 1012', 1012" as shown in FIG. 10A, or vice versa. Furthermore, either (but not both) enable gates 1012, 1016 of FIG. 10 could be replaced by a resistor 1004b, 1008c or series transistors 1004d, 1008e as shown in FIGS. 10B-10E. In the case where the enable gate to Vcc 1016 of FIG. 10 is replaced by p-channel series transistors 1016d (FIG. 10D), the transistors would have their gates tied to $V_A$, where ground $<=V_A<V_{TP}$. In the case where the enable gate 1012 to ground of FIG. 10 is replaced by n-channel series transistors 1012e (FIG. 10E), the transistors would have their gates tied to VB, where $V_{TN}<V_B<=Vcc$.

Figure 11:
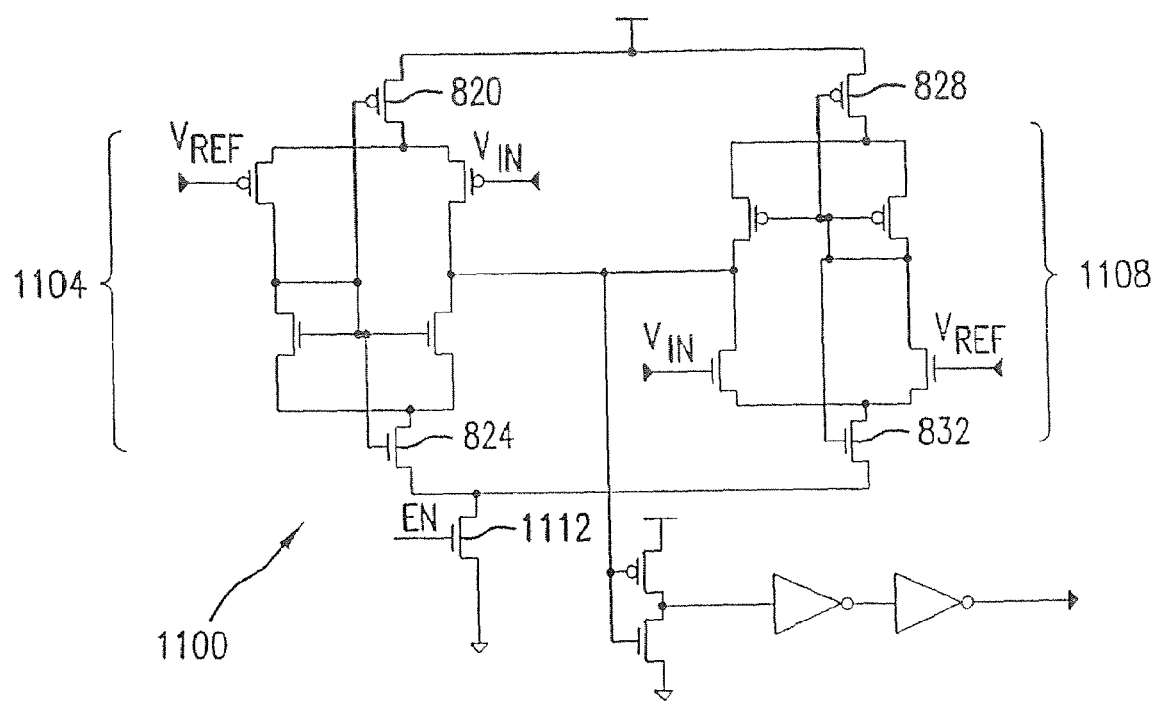

Another embodiment of the present invention is shown in FIG. 11, wherein a p-differential amplifier 1104 is fully self-biased, while an n-differential amplifier 1108 is also fully self-biased. Both amplifiers 1104 ad 1108 share an n-channel enable gate 1112 to ground. However, the bias transistors 820, 828 are directly tied to Vcc.

Additional variations of the FIG. 11 embodiment could include replacing any one of the four biasing transistors 820, 828, 824, 832 with a direct connection to Vcc (for replaced transistors 820, 828) or enable gate transistor 1112 (for transistors 824, 832), which would then make one of the two differential amplifiers 1104 and 1108 half self-biased.

Figure 11A:
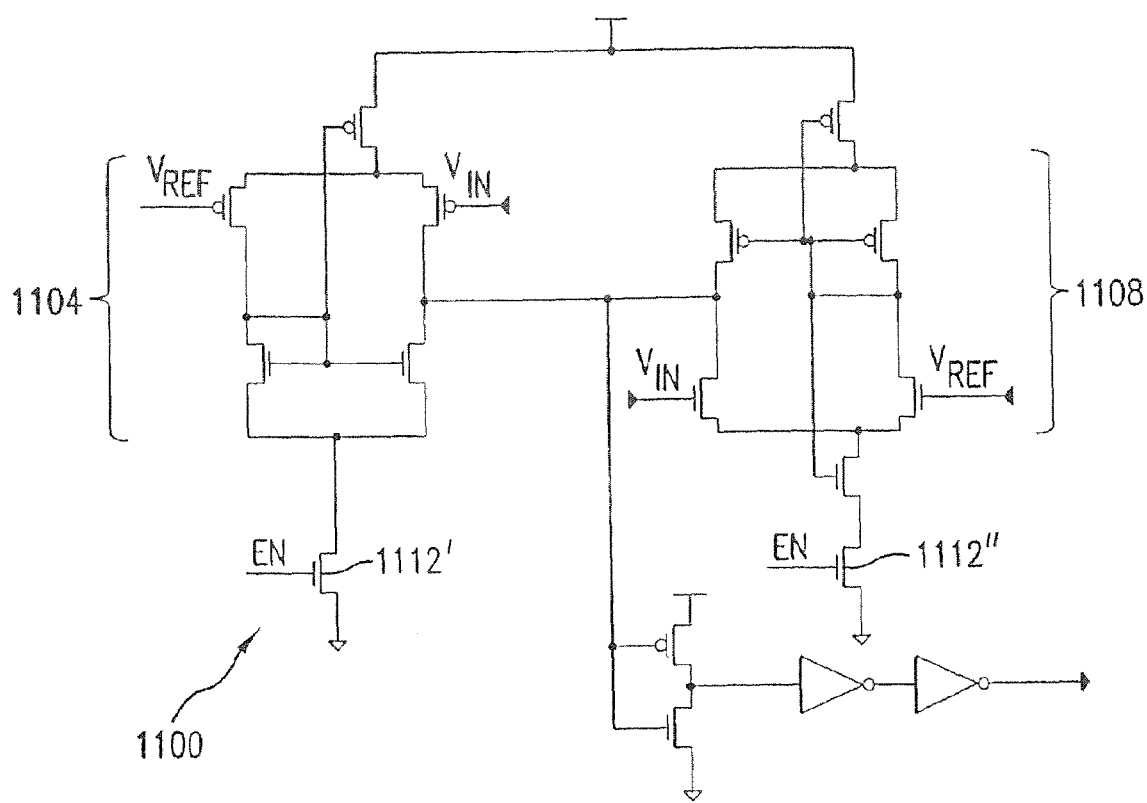
FIGS. 11A, 11B, and 11C show variations of that embodiment.
Figure 11B:
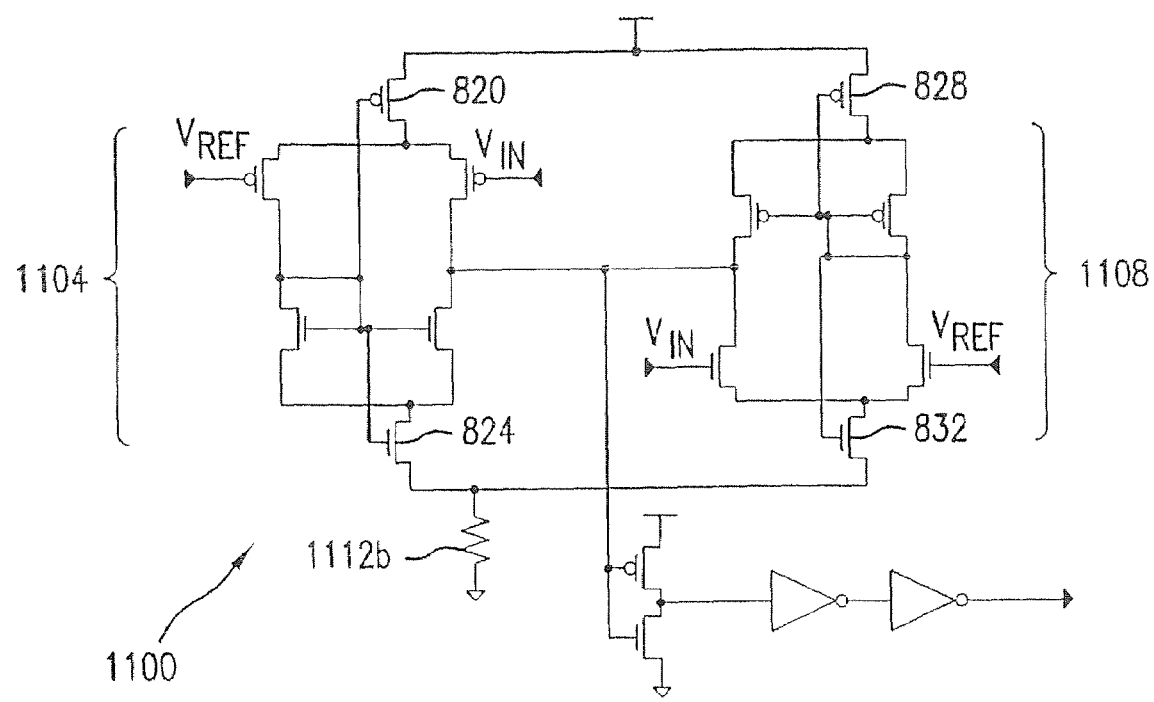
Figure 11C:
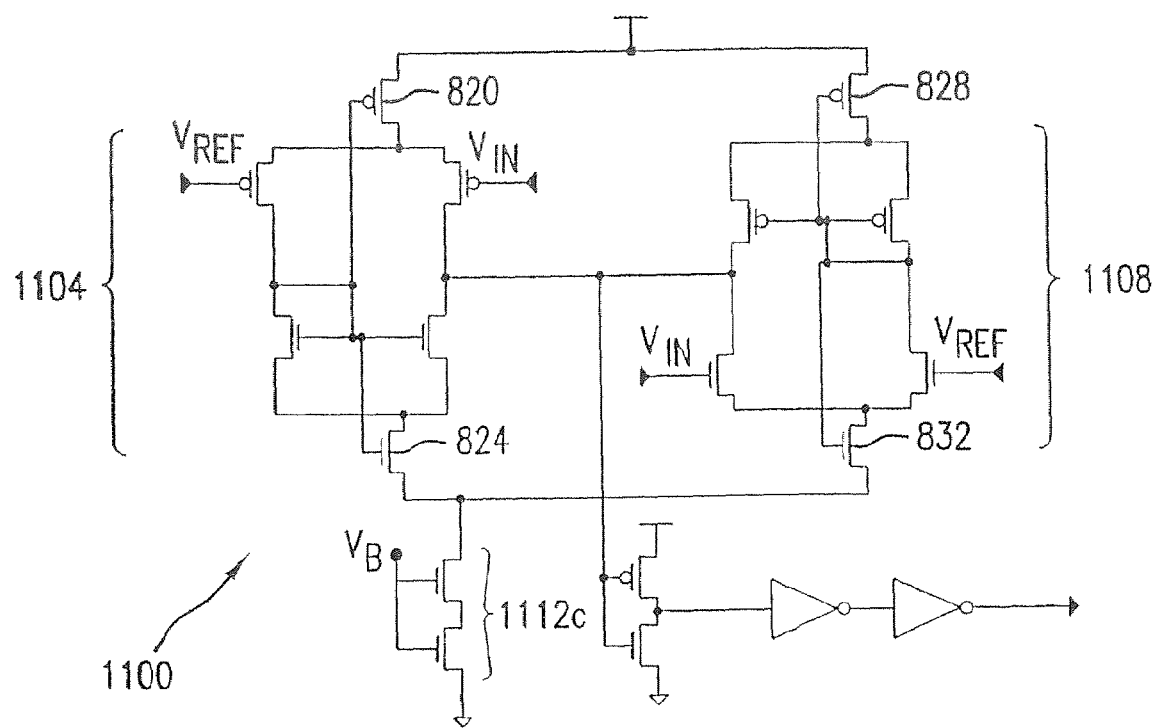

Additionally, FIG. 11 shows both p- and n-differential amplifiers 1104, 1108 sharing the enable gate 1112. However, each differential amplifier could have its own enable gate 1112', 1112" as shown in FIG. 11A. Furthermore, enable gate 1112 of FIG. 11 could be replaced by a resistor 1112b or series transistors 1112c, as shown in FIGS. 11B and 11C respectively. In the case where the enable gate 1112 to ground is replaced by n-channel series transistors 1112c, the transistors would have their gates tied to $V_B$, where $V_{TN}<V_B<=Vcc$.

Figure 12:
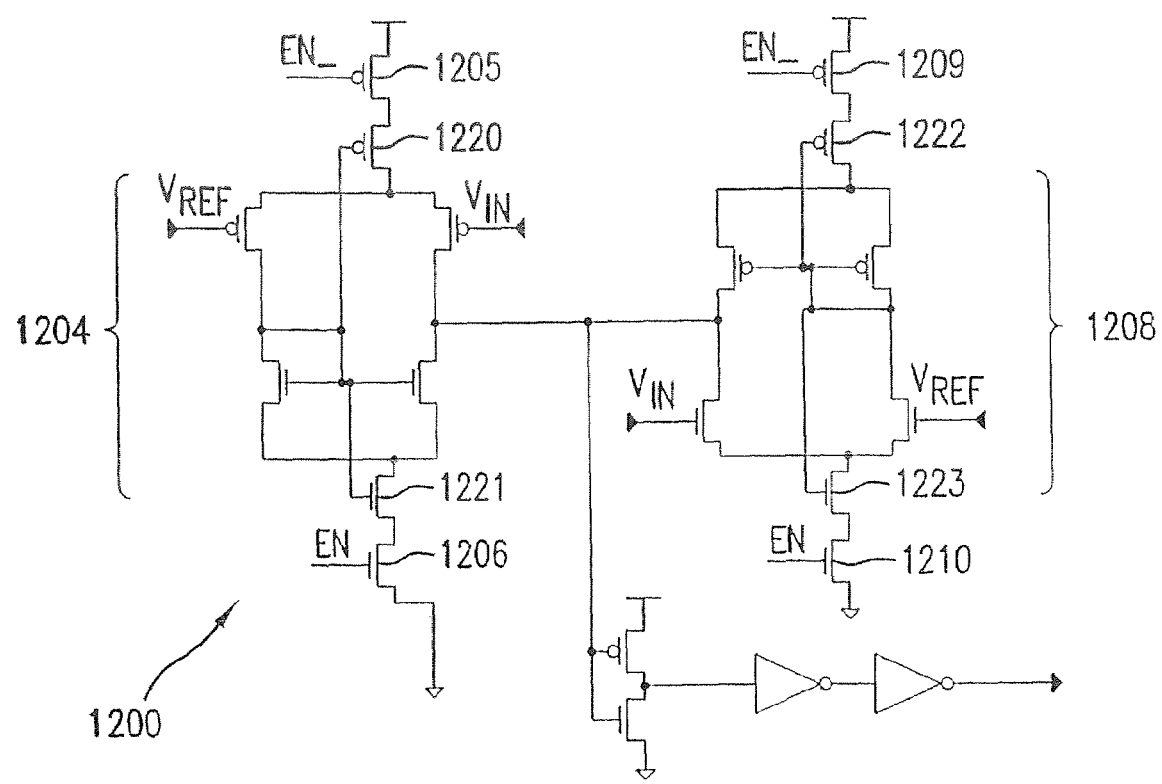

Another embodiment of the present invention is shown in FIG. 12, wherein a p-differential amplifier 1204 is fully self-biased, and an n-differential amplifier 1208 is also fully self-biased. Both amplifiers 1204 and 1208 have their own enable gates to both Vcc (1205, 1209) and to ground (1206, 1210).

Figure 12A:
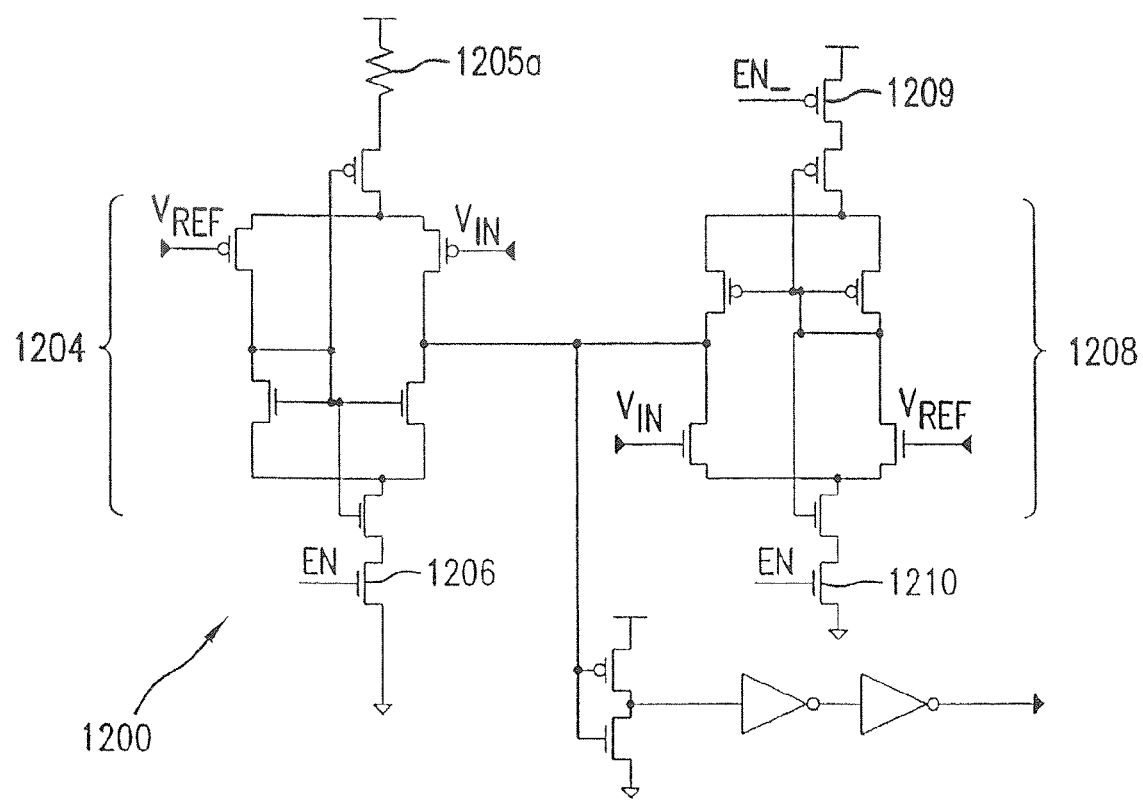
FIGS. 12A, 12B, 12C, and 12D show variations of that embodiment.
Figure 12B:
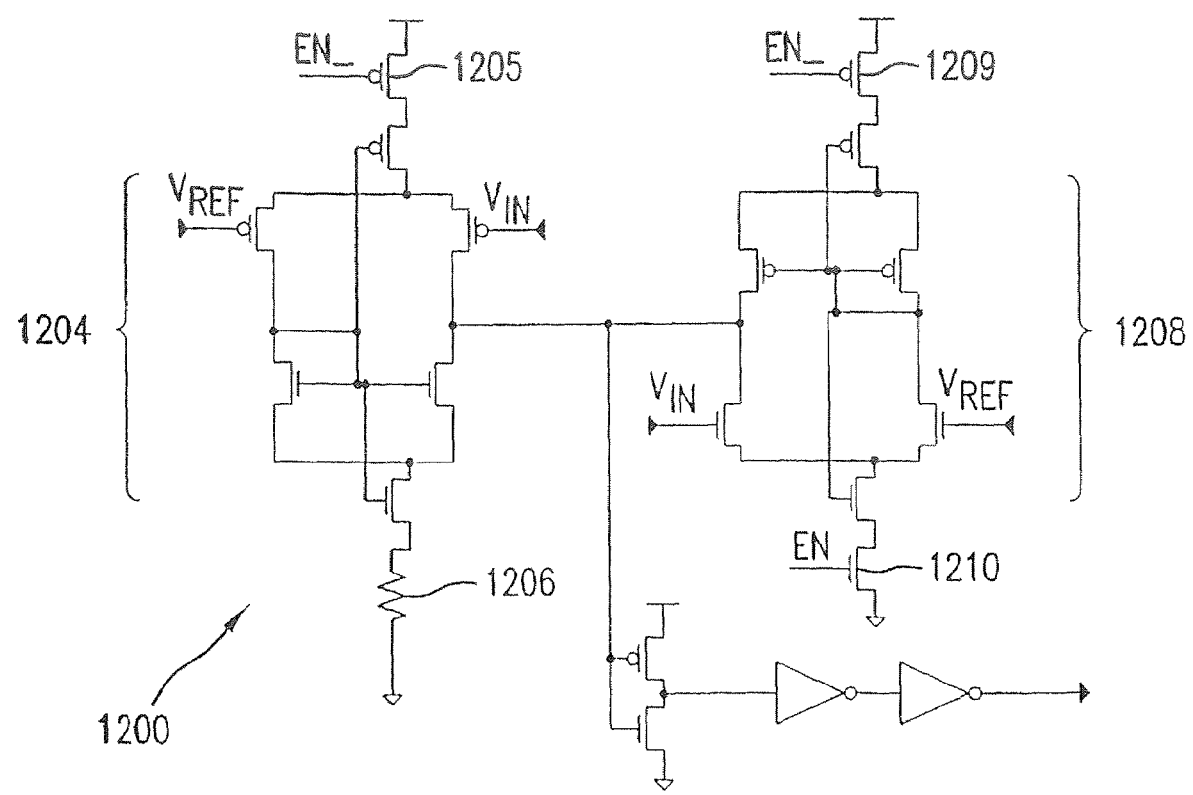
Figure 12C:
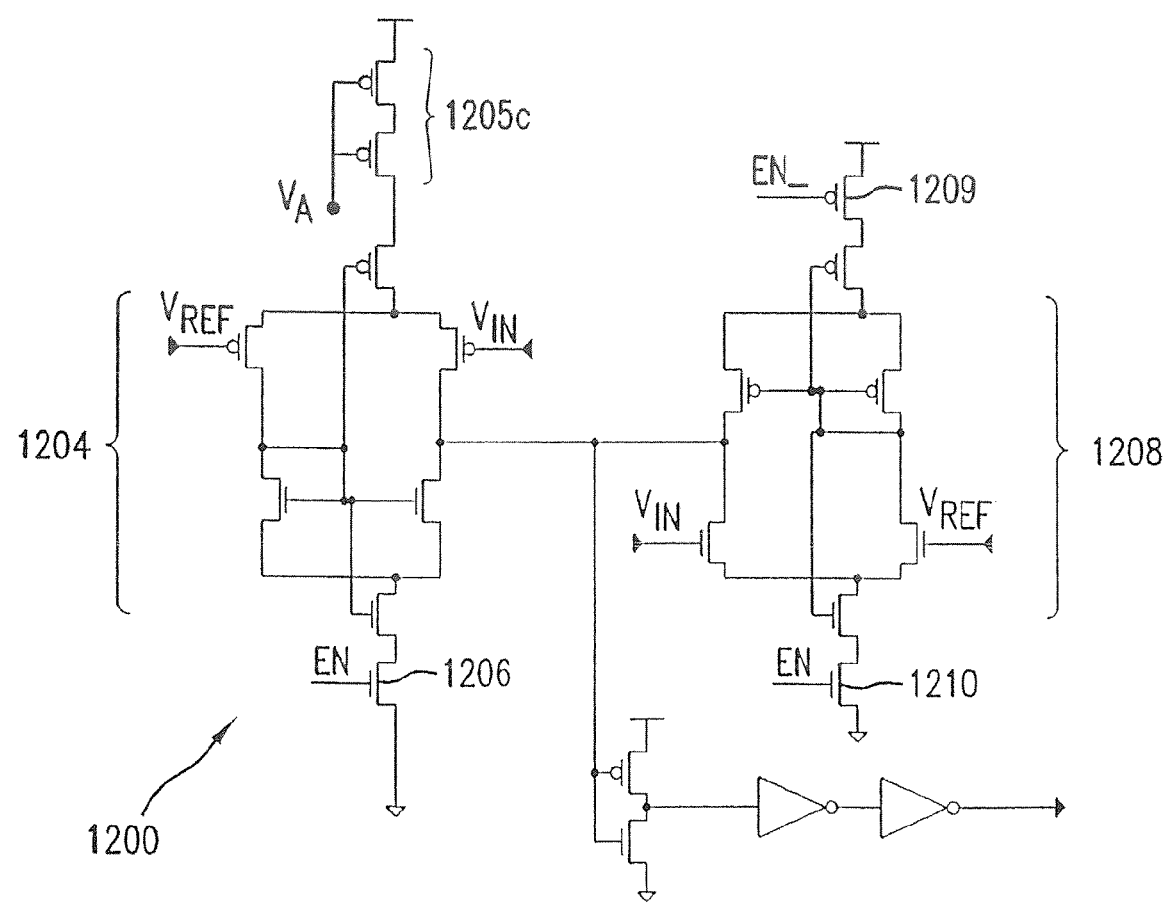
Figure 12D:
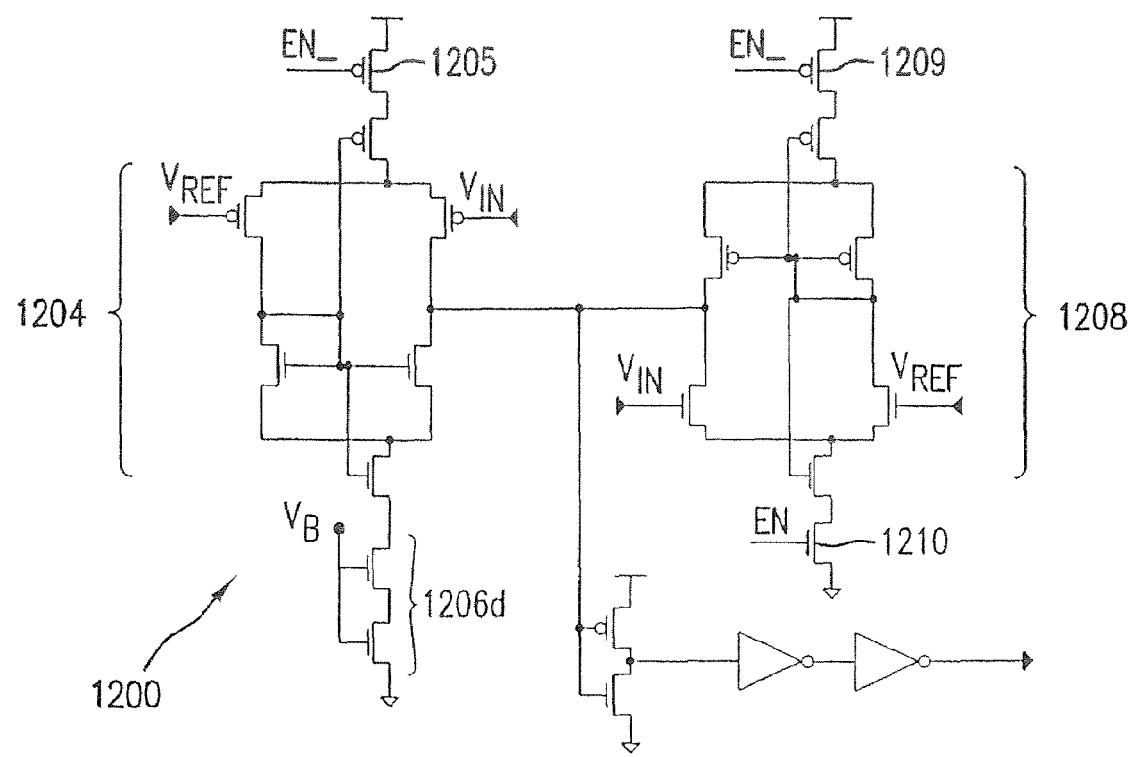

Additional variations of the FIG. 12 embodiment could include replacing any one of the biasing transistors 1220, 1221, 1222, 1223 with a direct connection, which would then make one of the differential amplifiers only half self-biased, while the other would remain fully self-biased. Furthermore, one or more of the enable gates 1205, 1206, 1209, 1210 could be replaced by a resistor or series transistors, as shown in FIGS. 12A, 12B for replacing one or both of transistor enable gate 1206, 1209 and FIGS. 12C, 12D for replacing one or both of enable gate transistors 1205, 1210. In the case where an enable gate to Vcc is replaced by p-channel series transistors, the transistors would have their gates tied to ground. In the case where an enable gate to ground is replaced by n-channel series transistors, the transistors would have their gates tied to $V_B$, where $V_{TN}<V_B<=Vcc$.

Figure 13:
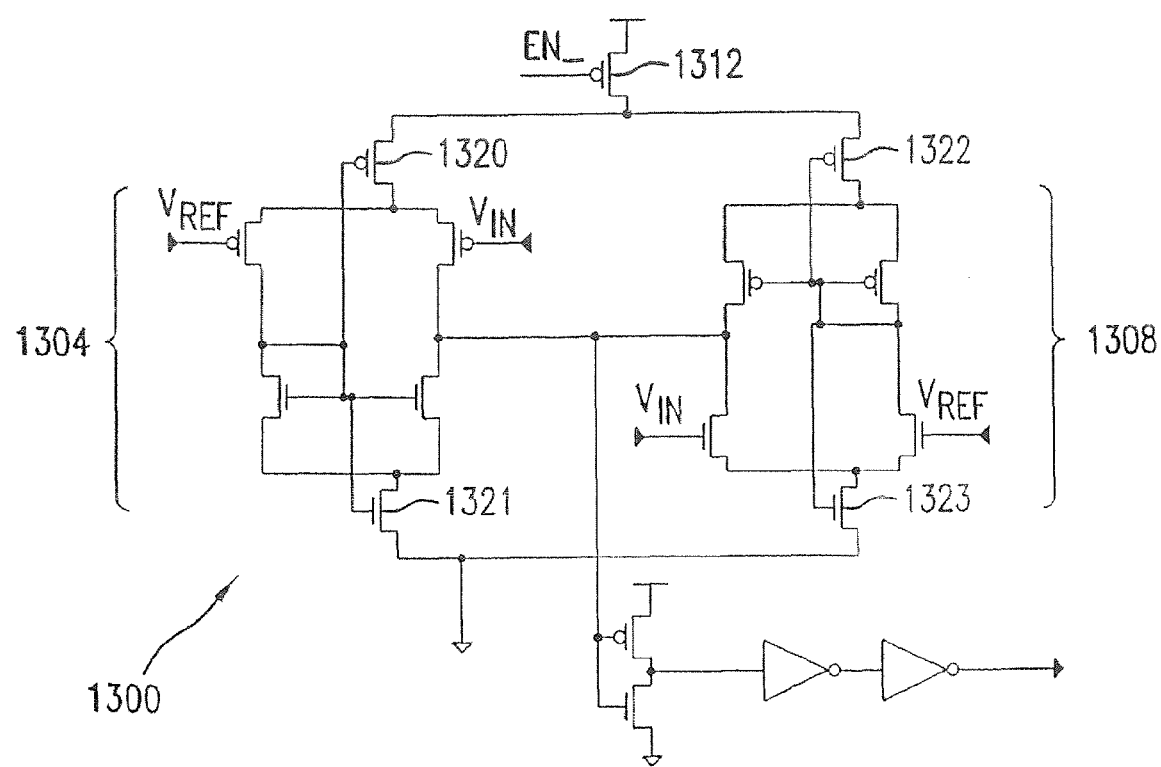

Another embodiment of the present invention is shown in FIG. 13, wherein a p-differential amplifier 1304 is fully self-biased by transistors 1320, 1321, and an n-differential amplifier 1308 is also fully self-biased by transistor 1322, 1323. The amplifiers 1304 and 1308 share a p-channel enable gate 1312 to Vcc while bias transistors 1321, 1323 are tied to ground.

Figure 13A:
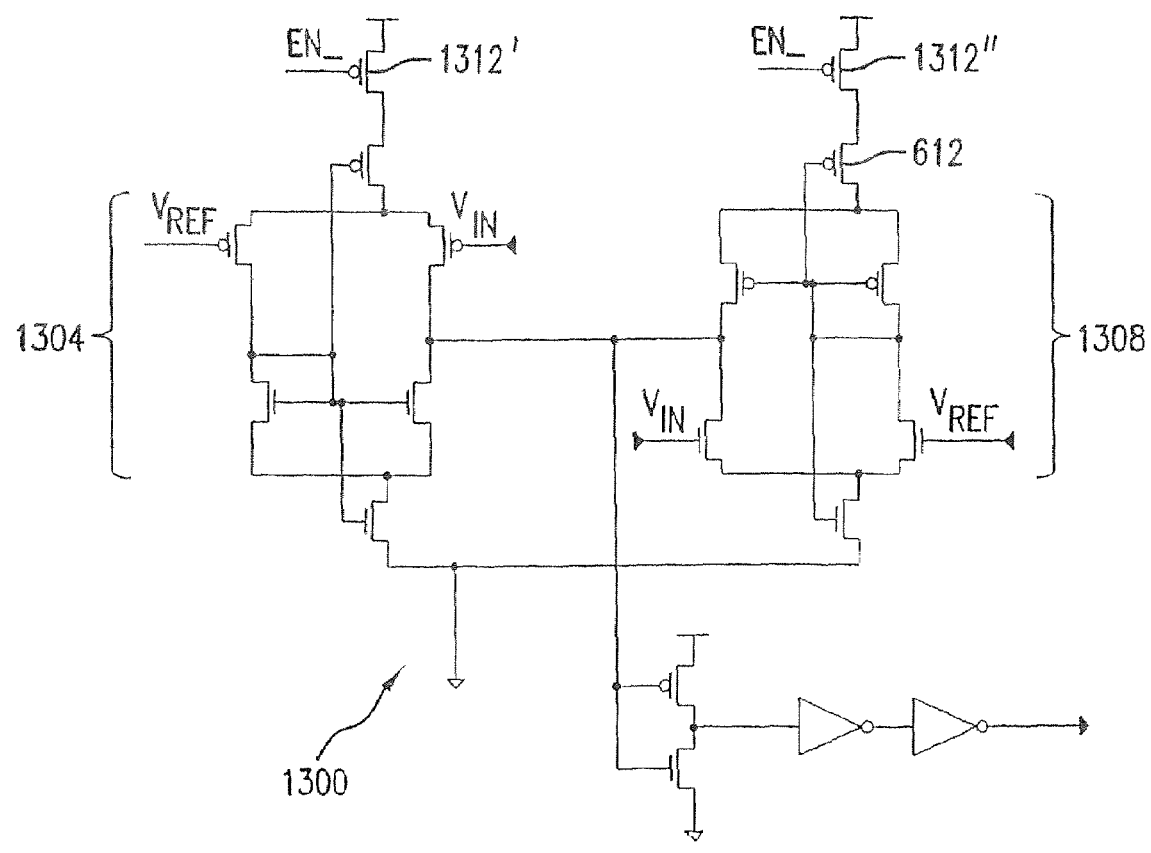
FIGS. 13A, 13B, and 13C show variations of that embodiment.
Figure 13B:
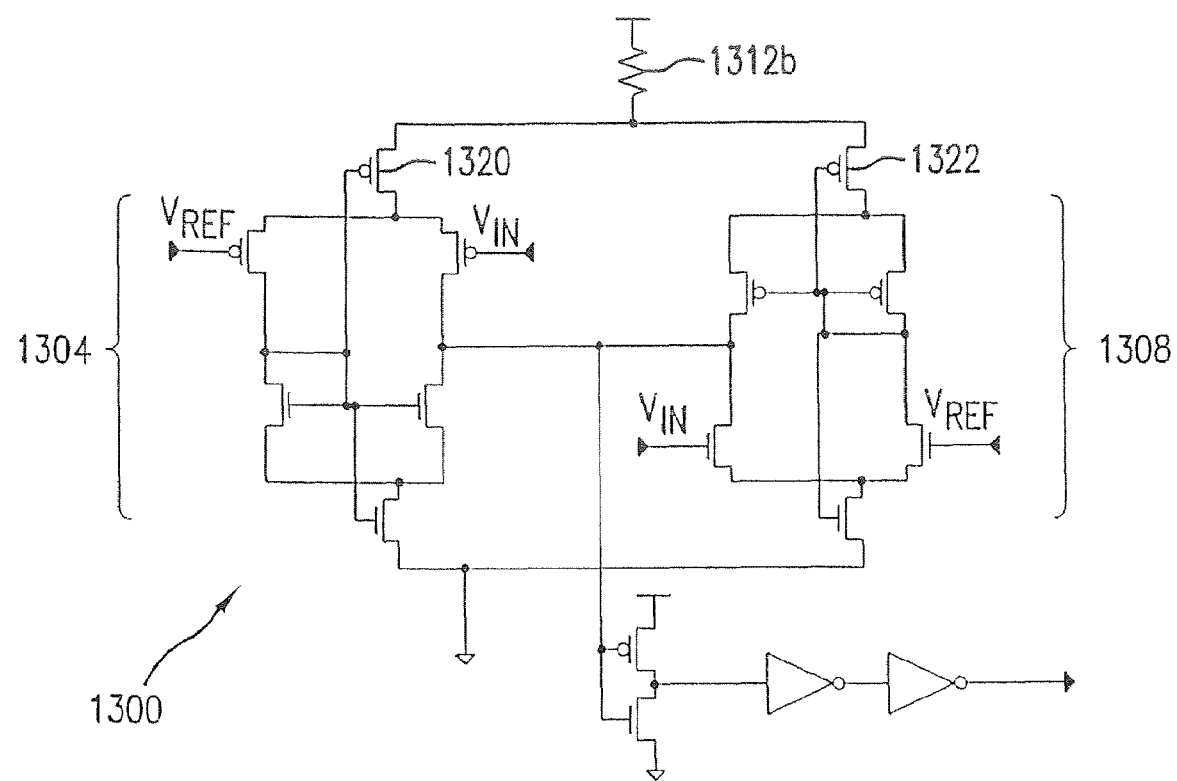
Figure 13C:
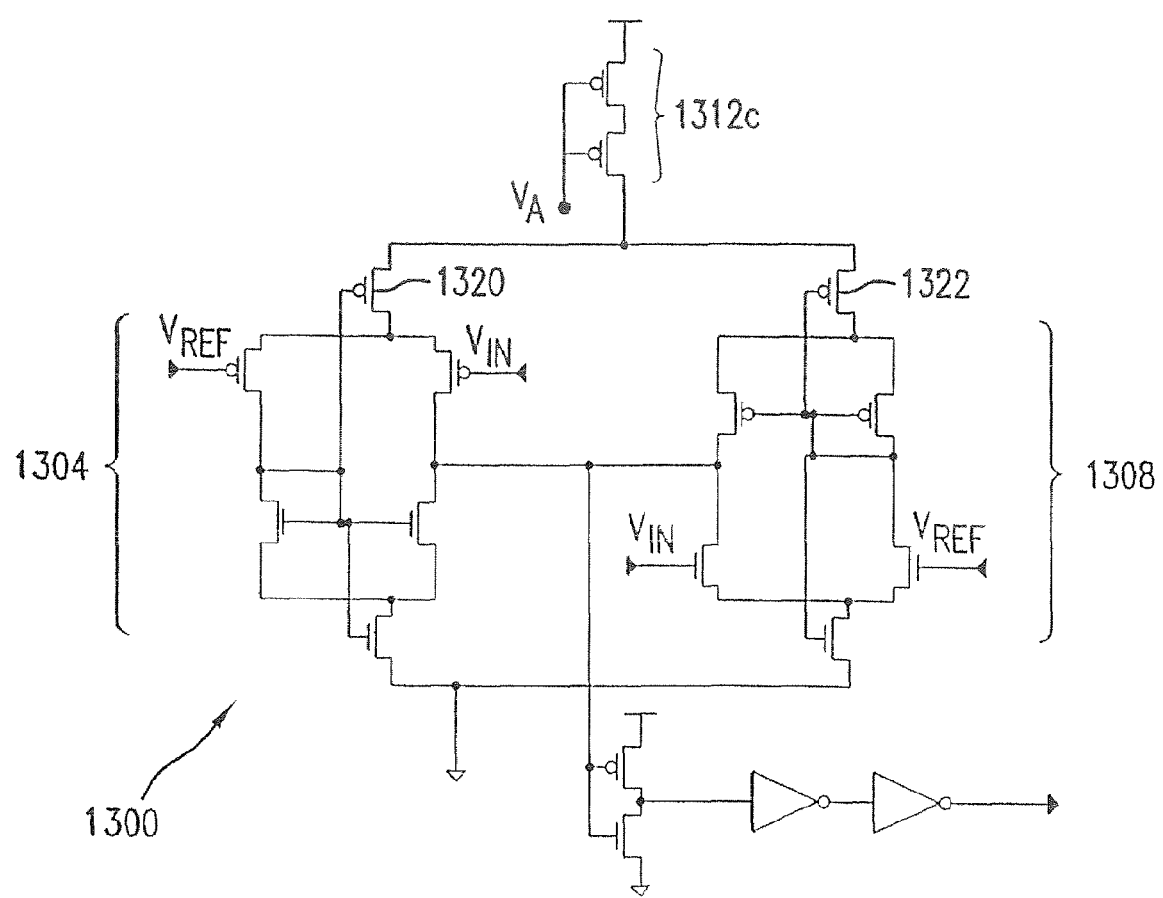

Additional variations of the FIG. 13 embodiment include replacing one of the biasing transistors 1320, 1321, 1322, and 1323 with a direct connection, which would then make one of the differential amplifiers 1304, 1308 only half self-biased, while the other would remain fully self-biased. Additionally, FIG. 13 shows both differential amplifiers 1304, 1308 sharing the enable gate 1312. However, each differential amplifier could have its own enable gate, 1312', 1312" as shown in FIG. 13A. Furthermore, the enable gate 1312 could be replaced by a resistor 1312b (FIG. 13B) or series transistors 1312c (FIG. 13C) with their gates tied to $V_A$, where ground $<=V_A<V_{TP}$.

Figure 14:
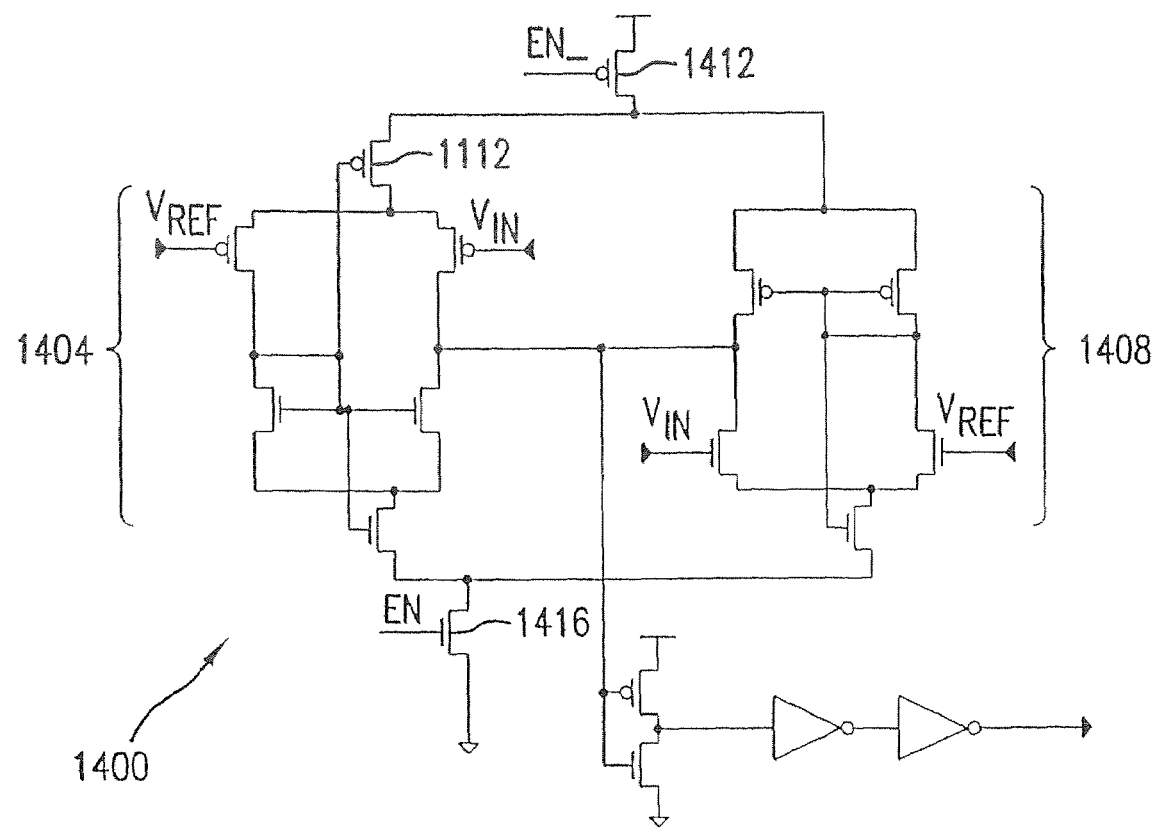

Another embodiment of the present invention is shown in FIG. 14, wherein a p-differential amplifier 1404 is fully self-biased, while an n-differential amplifier 1408 is half self-biased. The amplifiers 1404 and 1408 share a p-channel enable gate 1412 to Vcc and an n-channel enable gate 1416 tied to ground.

Figure 14A:
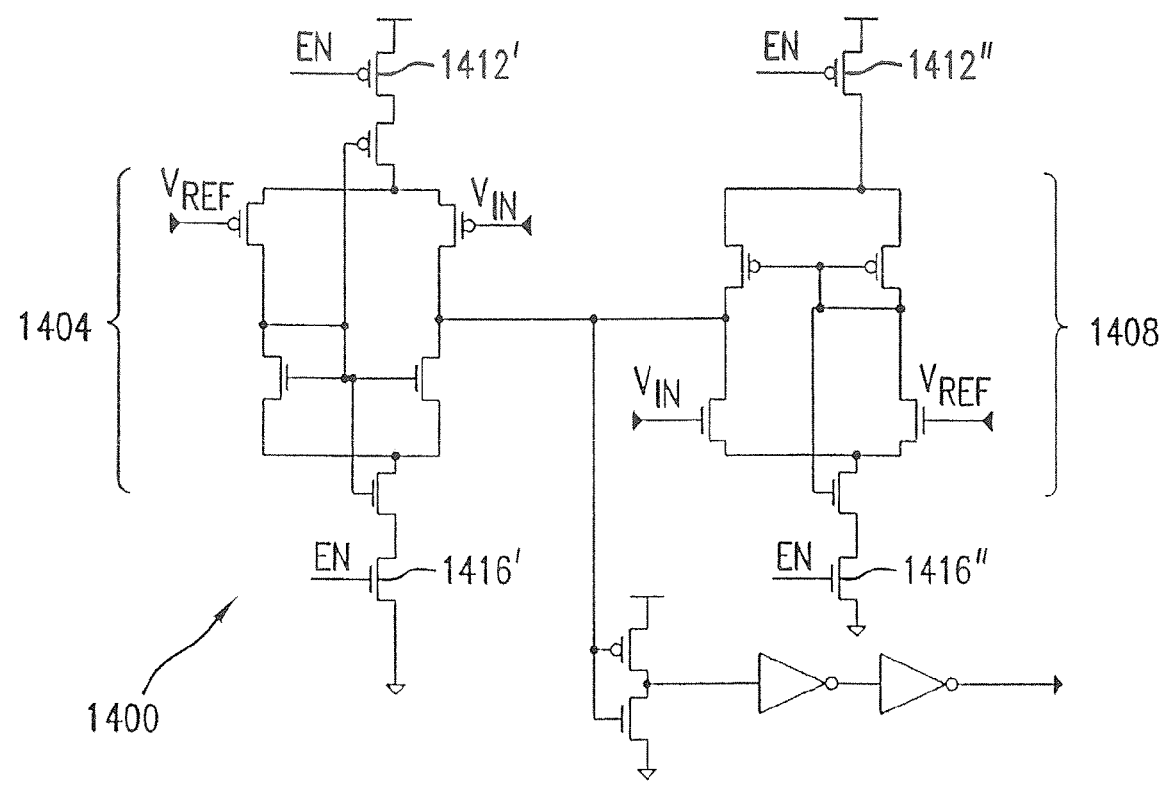
FIGS. 14A, 14B, 14C, 14D, and 14E show variations of that embodiment.
Figure 14B:
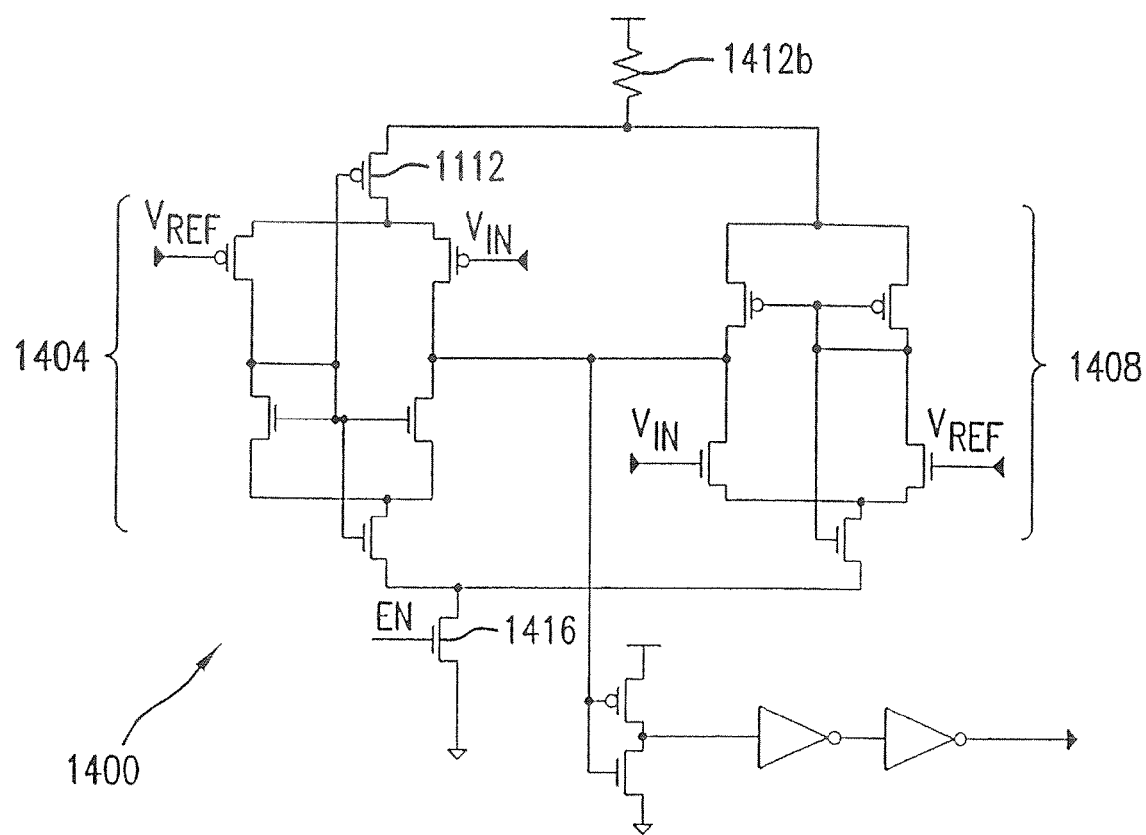
Figure 14C:
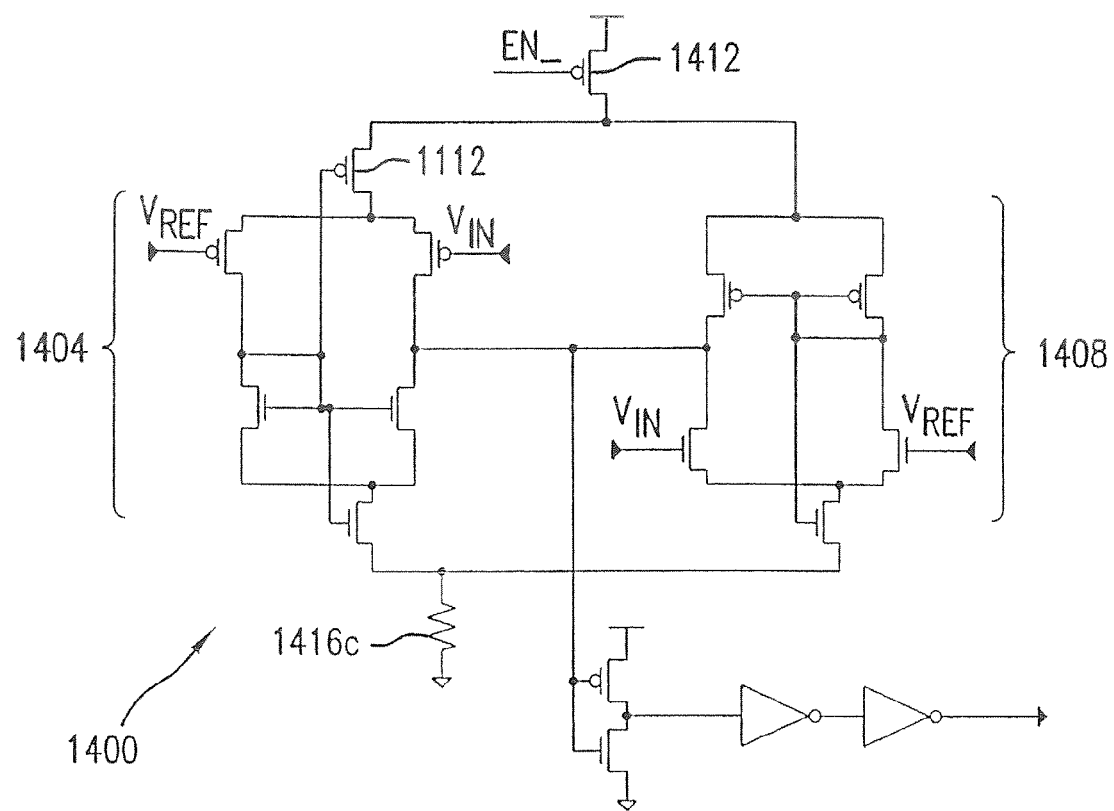
Figure 14D:
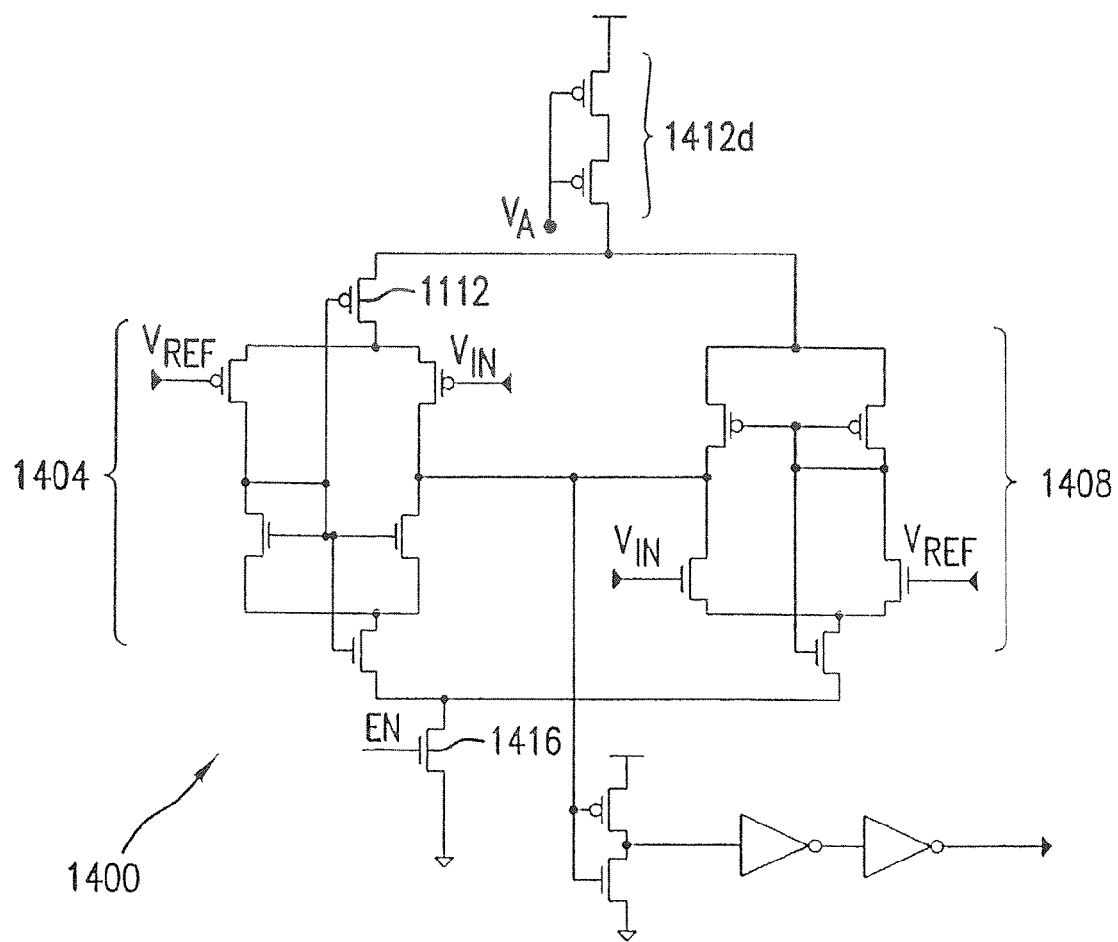
Figure 14E:
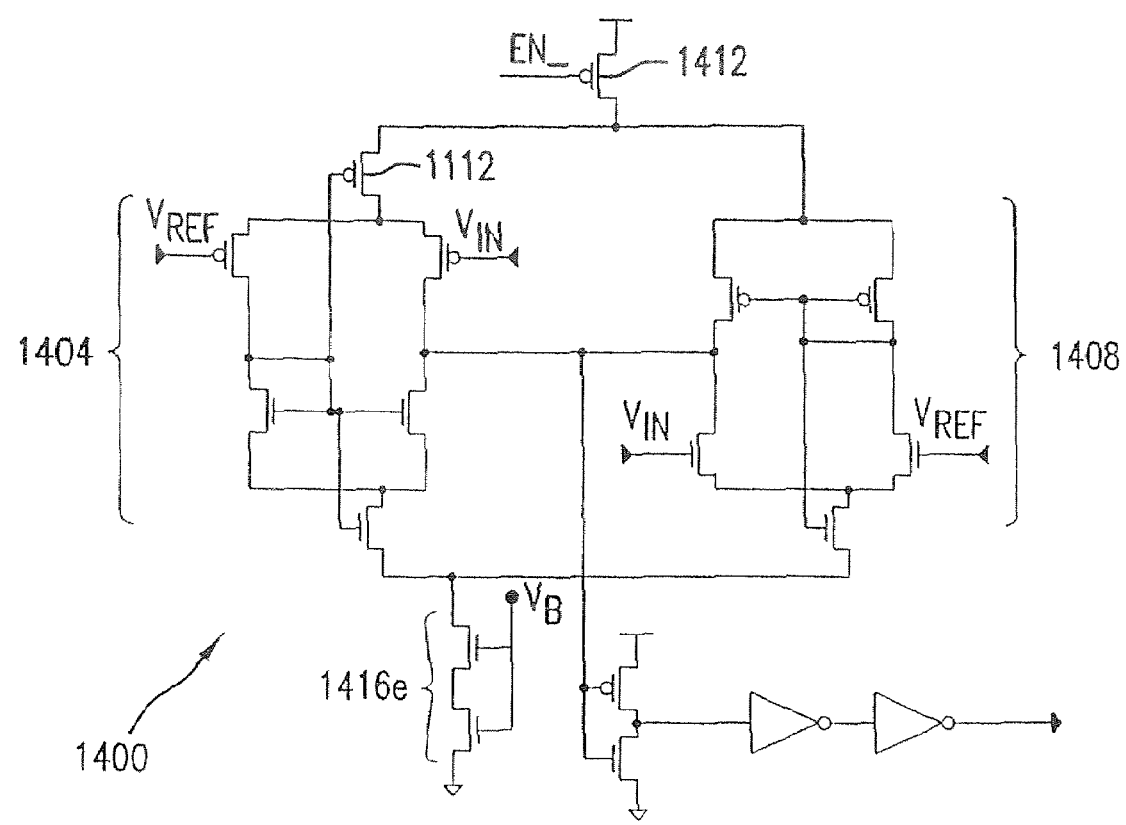

Additional variations of the FIG. 14 embodiment include each differential amplifier having its own enable gate 1412', 14122", 1416', and 1416" as shown in FIG. 14A. Additionally, each differential amplifier 1464, 1408 could share enable gate 1412 of FIG. 14, but have separate enable gates 1416', 1416" instead of enable gate 1416 as in FIG. 14A, or vice versa. Furthermore, either (but not both) enable gates 1412, 1416 of FIG. 14 could be replaced by a resistor or series transistors, as shown in FIGS. 14B and 14D for enable gate 1412, and FIGS. 14C and 14E for enable gate 1416. In the case where the enable gate 1412 to Vcc is replaced by p-channel series transistors, the transistors would have their gates tied to $V_A$, where ground $<=V_A<V_{TP}$. In the case where the enable gate 1416 to ground is replaced by n-channel series transistors (FIG. 14E), the transistors would have their gates tied to $V_B$, where $V_{TN}<V_B<=VCC$.

Figure 15:
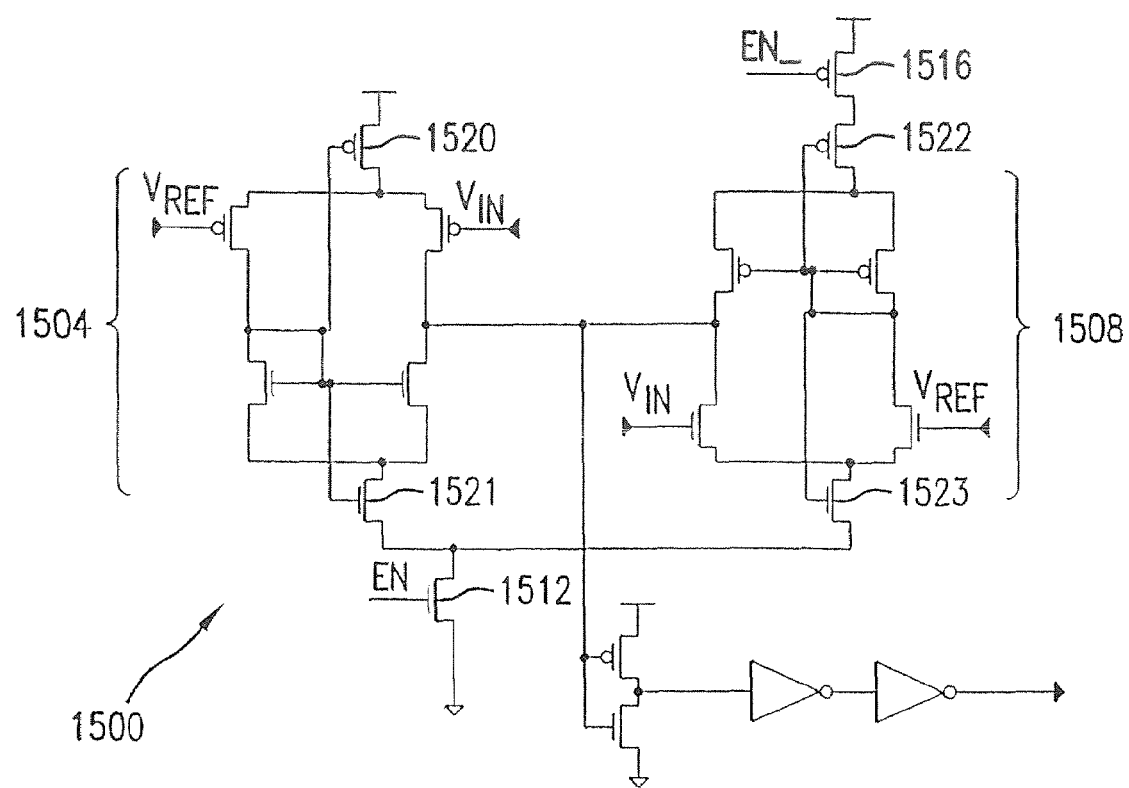

Another embodiment of the present invention is shown in FIG. 15, wherein a p-differential amplifier 1504 is fully self-biased by transistors 1520, 1521, and an n-differential amplifier 1508 is also fully self-biased by transistor 1521, 1523. The amplifiers 1504 and 1508 share an n-channel enable 1512 gate to ground, while the n-differential amplifier 1508 has its own separate p-channel enable gate 1516 to Vcc.

Figure 15A:
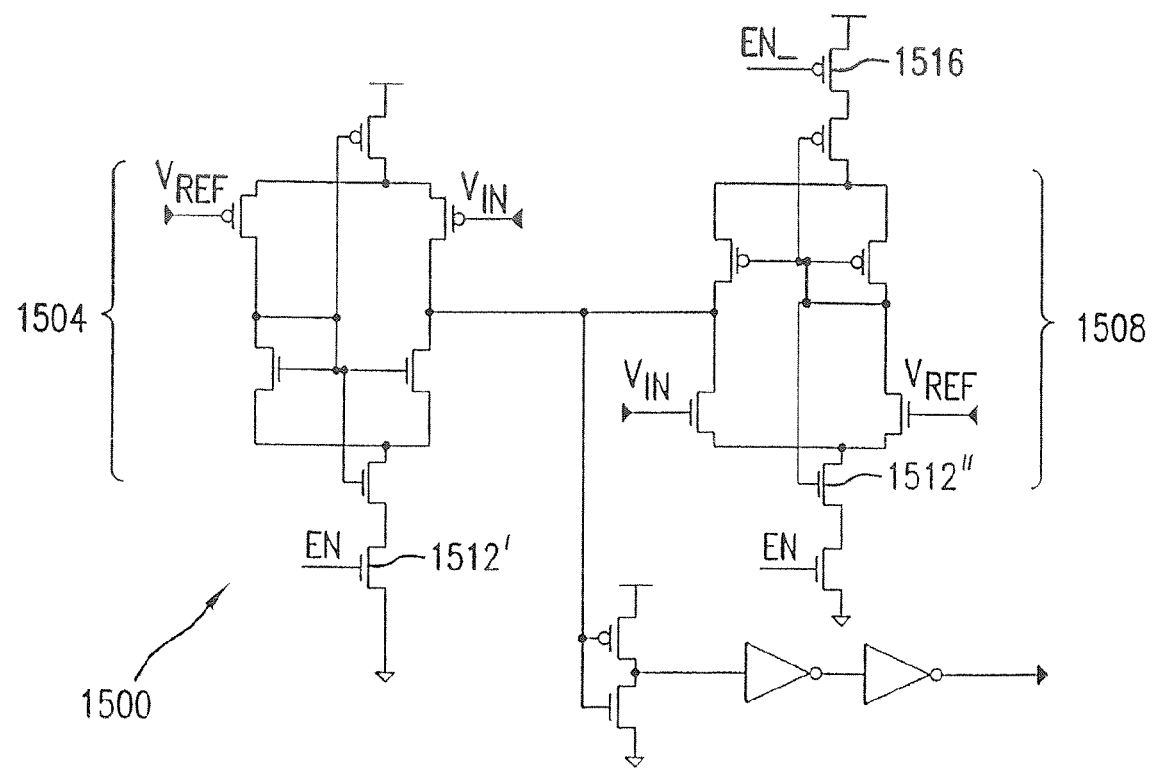
FIGS. 15A, 15B, 15C, 15D, and 15E show variations of that embodiment.
Figure 15B:
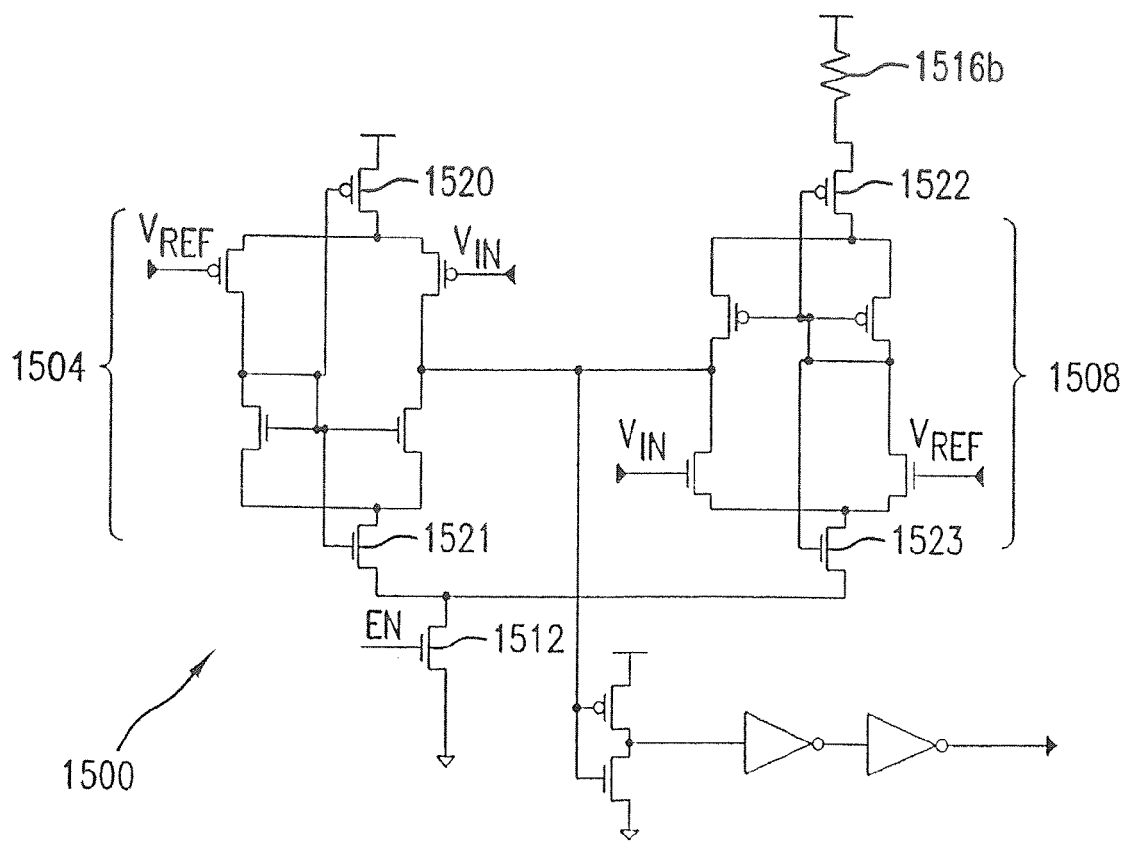
Figure 15C:
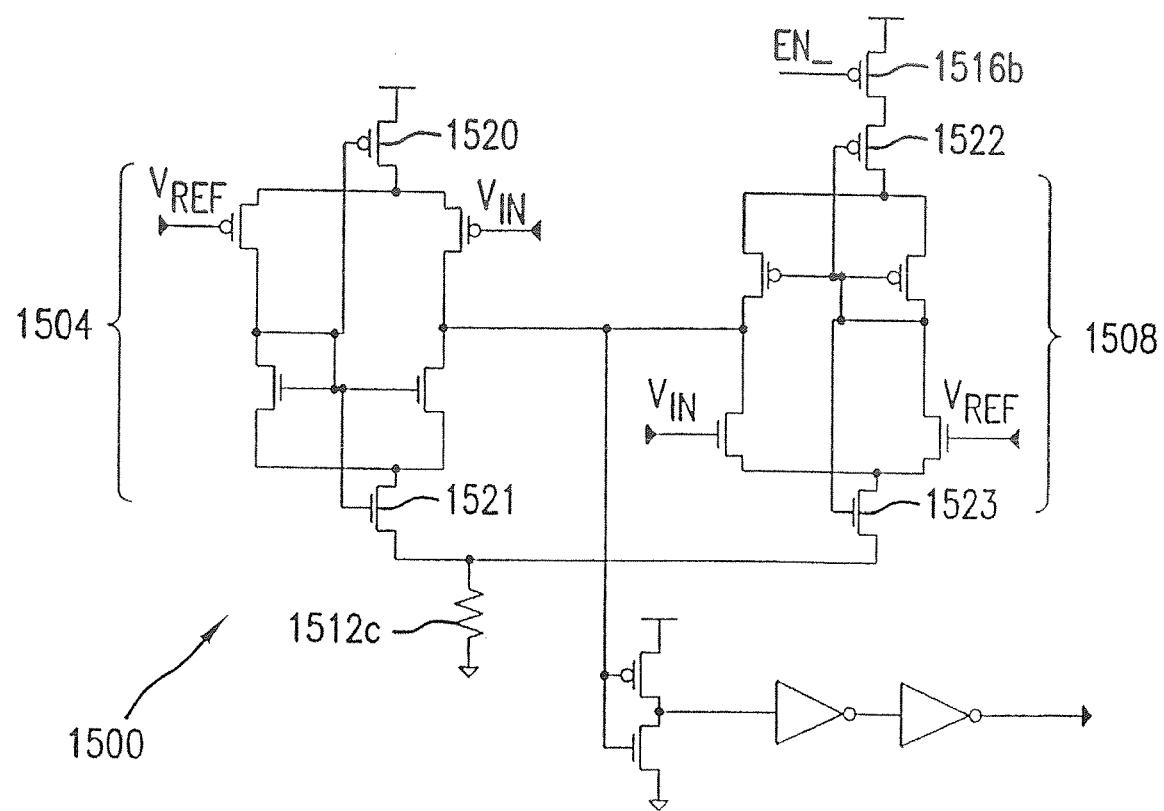
Figure 15D:
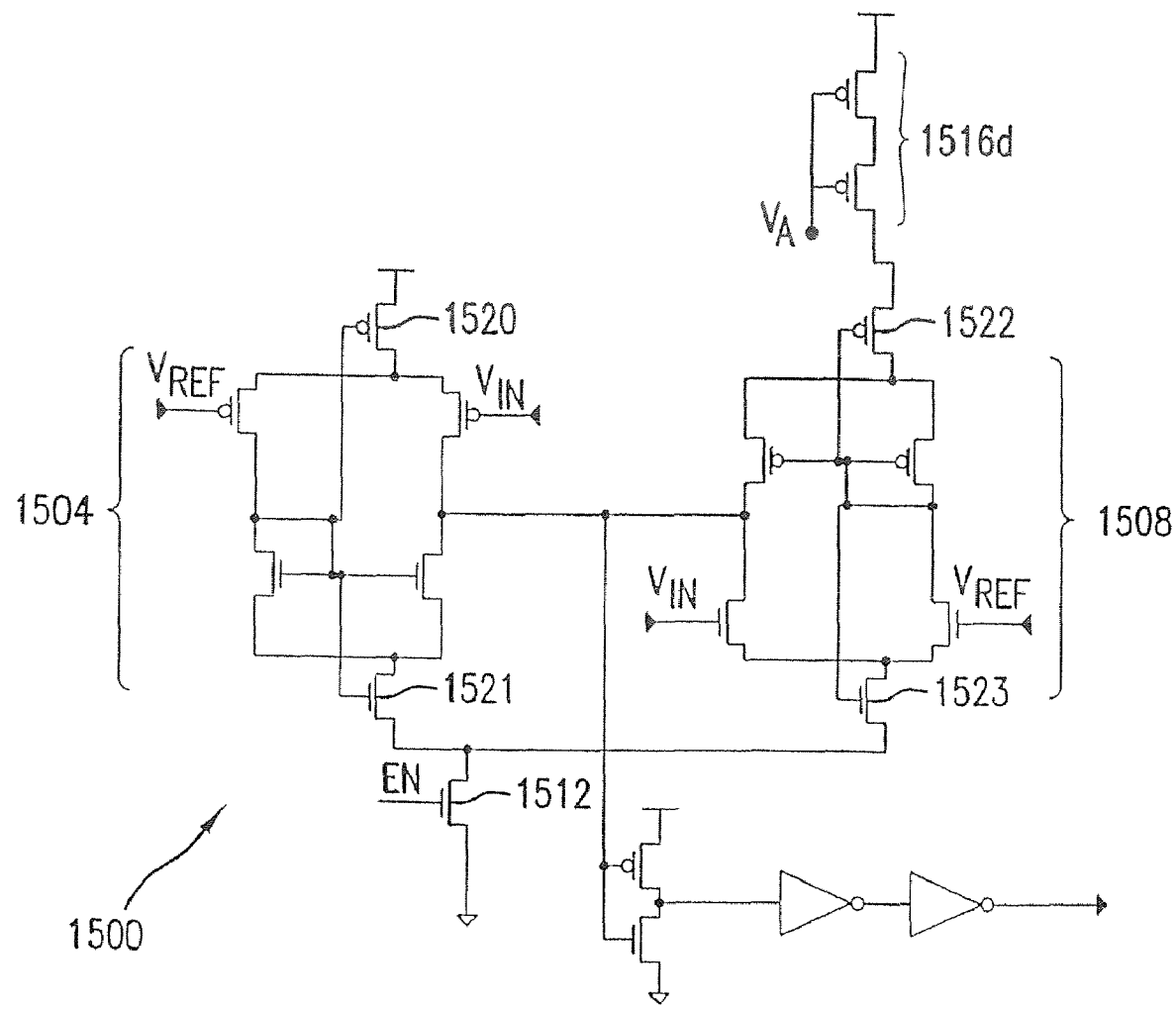
Figure 15E:
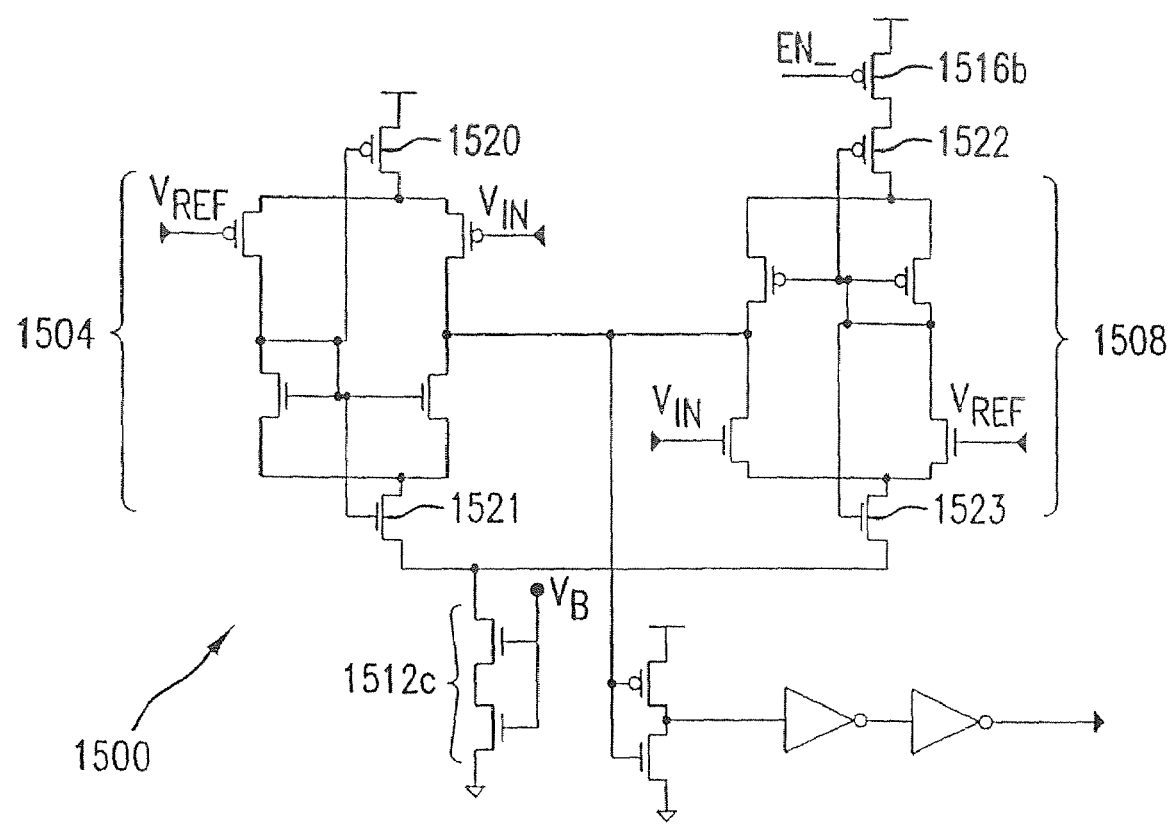

Additional variations of the FIG. 15 embodiment include replacing one of the biasing transistors 1520, 1521, 1522, and 1523 of FIG. 15 with a direct connection, which would then make one of the differential amplifiers 1504, 1508 only half self-biased, while the other would remain fully self-biased. Additionally, FIG. 15 shows both differential amplifiers 1504, 1508 sharing enable gate 1512. However, each differential amplifier could have its own enable gate 1512', 1512", as shown in FIG. 15A. Furthermore, the enable gate 1516 of FIG. 15 could be replaced by a resistor 1516b (FIG. 15B) or series transistors 1516d (FIG. 15D) with their gates tied to $V_A$, where ground $<=V_A<V_{TP}$. Additionally, the enable gate 1512 of FIG. 15 could be replaced by a resistor 1512c (FIG. 15C) or series transistors 1512e (FIG. 15E) with their gates tied to $V_B$, where $V_{TN}<V_B<=Vcc$.

Figure 16:
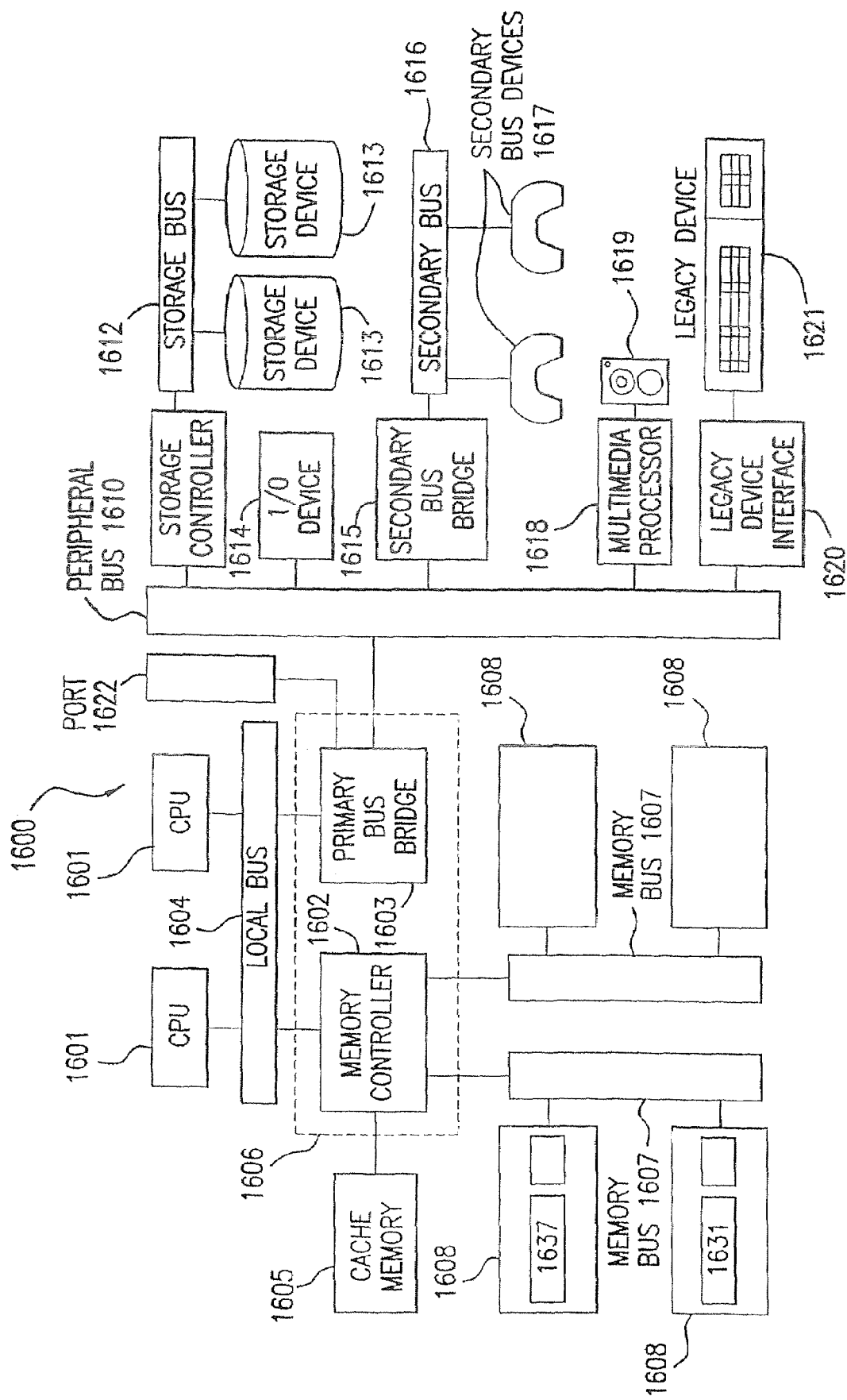
FIG. 16 show the present invention as part of a processor system.

The present invention can be utilized within any integrated circuit which receives an input signal from an external source. FIG. 16 illustrates an exemplary processing system 1600 which may utilize an electronic device comprising a self-biasing buffer constructed in accordance with any of the embodiments of the present invention disclosed above in connections with FIG. 6 through 15E The processing system 1600 includes one or more processors 1601 coupled to a local bus 1604. A memory controller 1602 and a primary bus bridge 1603 are also coupled the local bus 1604. The processing system 1600 may include multiple memory controllers 1602 and/or multiple primary bus bridges 1603. The memory controller 1602 and the primary bus bridge 1603 may be integrated as a single device 1606.

The memory controller 1602 is also coupled to one or more memory buses 1607. Each memory bus accepts memory components 1608 which include at least one memory device 1631 contains a buffer device of the present invention. The memory components 1608 may be a memory card or a memory module. Examples of memory modules include single inline memory modules (SIMMs) and dual inline memory modules (DIMMs). The memory components 1608 may include one or more additional devices 1609. For example, in a SIMM or DIMM, the additional device 1609 might be a configuration memory, such as a serial presence detect (SPD) memory. The memory controller 1602 may also be coupled to a cache memory 1605. The cache memory 1605 may be the only cache memory in the processing system. Alternatively, other devices, for example, processors 1601 may also include cache memories, which may form a cache hierarchy with cache memory 1605. If the processing system 1600 include peripherals or controllers which are bus masters or which support direct memory access (DMA), the memory controller 1602 may implement a cache coherency protocol. If the memory controller 1602 is coupled to a plurality of memory buses 16016, each memory bus 16016 may be operated in parallel, or different address ranges may be mapped to different memory buses 1607.

The primary bus bridge 1603 is coupled to at least one peripheral bus 1610. Various devices, such as peripherals or additional bus bridges may be coupled to the peripheral bus 1610. These devices may include a storage controller 1611, an miscellaneous I/O device 1614, a secondary bus bridge 1615, a multimedia processor 1618, and an legacy device interface 1620. The primary bus bridge 1603 may also coupled to one or more special purpose high speed ports 1622. In a personal computer, for example, the special purpose port might be the Accelerated Graphics Port (AGP), used to couple a high performance video card to the processing system 1600. In addition to memory device 1631 which may contain a buffer device of the present invention, any other data input device of FIG. 16 may also utilize a buffer device of the present invention including the CPU 1601.

The storage controller 1611 couples one or more storage devices 1613, via a storage bus 1612, to the peripheral bus 1610. For example, the storage controller 1611 may be a SCSI controller and storage devices 1613 may be SCSI discs. The I/O device 1614 may be any sort of peripheral. For example, the I/O device 1614 may be an local area network interface, such as an Ethernet card. The secondary bus bridge may be used to interface additional devices via another bus to the processing system. For example, the secondary bus bridge may be an universal serial port (USB) controller used to couple USB devices 1617 via to the processing system 1600. The multimedia processor 1618 may be a sound card, a video capture card, or any other type of media interface, which may also be coupled to one additional devices such as speakers 1619. The legacy device interface 1620 is used to couple legacy devices, for example, older styled keyboards and mice, to the processing system 1600. In addition to memory device 1631 which may contain a buffer device of the invention, any other data input device of FIG. 16 may also utilize a buffer device of the invention, including a CPU 1601.

The processing system 1600 illustrated in FIG. 16 is only an exemplary processing system with which the invention may be used. While FIG. 16 illustrates a processing architecture especially suitable for a general purpose computer, such as a personal computer or a workstation, it should be recognized that well known modifications can be made to configure the processing system 1600 to become more suitable for use in a variety of applications. For example, many electronic devices which require processing may be implemented using a simpler architecture which relies on a CPU 1601 coupled to memory components 1608 and/or memory buffer devices 304. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A differential input buffer, comprising:
    a buffer circuit having separate p- and n-channel differential amplifiers arranged to each receive a pair of input signals, said p- and n-channel differential amplifiers each being at least partially self-biased;
    a first pair of enabling series transistors, wherein said p- and n-channel differential amplifiers are each coupled to said first pair of enabling series transistors;
    at least one of said p-channel differential amplifier and said n-channel differential amplifier is coupled to another enable transistor, said another transistor having a gate for receiving an enabling signal; and
    a first output terminal for combining first outputs of said p- and n-channel differential amplifiers to form a first output of said differential input buffer,
    wherein each of said p-channel differential amplifier and said n-channel differential amplifier are mirrored.

2. The input buffer of claim 1, wherein one transistor of said first pair of enabling series transistors is coupled to ground.

3. The input buffer of claim 1, wherein:
    one transistor of said first pair of enabling series transistors is coupled to a ground terminal; and
    said another enable transistor is coupled to a supply voltage terminal.

4. The input buffer of claim 1, wherein each of said p-channel differential amplifier and said n-channel differential amplifier is coupled to respective biasing transistors.

5. The input buffer of claim 1, further comprising a second output terminal for combining second outputs of said p- and n-channel differential amplifiers to provide a complementary differential output.

6. The input buffer of claim 5, wherein each of said p-channel differential amplifier and said n-channel differential amplifier is coupled to respective enable biasing transistors.

7. A processing system circuit, comprising:
    a processor; and
    a memory circuit for exchanging data with said processor, wherein at least one of said processor and memory circuit comprise an input buffer circuit, said input buffer circuit further comprising:
        a buffer circuit having separate p- and n-channel differential amplifiers;
    wherein said separate p- and n-channel differential amplifiers are each at least partially self-biased and mirrored; and
        a first pair of enabling series transistors, wherein said p- and n-differential amplifiers are each coupled to said first pair of enabling series transistors,
        wherein first outputs of said differential amplifiers are combined to form a first output of said differential input buffer.

8. The processing system circuit of claim 7, wherein said first pair of enabling series transistors comprises a pair of n-channel transistors coupled to a ground terminal.

9. The processing system circuit of claim 7, wherein:
    said first pair of enabling series transistors comprises a pair of n-channel transistors coupled to ground; and
    said p- and n-channel differential amplifiers are each coupled to separate p-channel and n-channel biasing transistors.

10. The processing system circuit of claim 7, wherein:
    said first pair of enabling series transistors comprises a pair of n-channel transistors coupled to a ground terminal; and said p- and n-channel differential amplifiers are coupled to a shared p-channel enable transistor, which is coupled to a supply voltage terminal.

11. The processing system circuit of claim 7, further comprising a second output terminal for combining second outputs of said p- and n-channel differential amplifiers to provide a complementary differential output.

12. The processing system circuit of claim 11, wherein each of said p-channel differential amplifier and said n-channel differential amplifier is coupled to respective biasing transistors.

13. A method of operating an input buffer, comprising:
at least partially self-biasing a pair of separate p- and n-channel differential amplifiers;
enabling at least one of said p- and n-channel differential amplifiers, wherein said p- and n-differential amplifiers are coupled to a pair of enabling series transistors and another enabling transistor, said another enabling transistor having a gate for receiving an enabling signal;
mirroring each of said p-channel differential amplifier and said n-channel differential amplifier;
detecting an input signal;
comparing said input signal with a reference signal using said separate p and n-channel differential amplifiers; and providing the results of said comparison as a first output signal.

14. The method of claim 13, wherein said pair of enabling series transistors comprises a pair of n-channel transistors coupled to ground.

15. The method of claim 13, wherein:
said pair of enabling series transistors comprises a pair of n-channel transistors coupled to ground; and
said another enable transistor is coupled to a supply voltage.

16. The method of claim 13, wherein:
said pair of enabling series transistors comprise a pair of n-channel transistors coupled to ground; and
said p- and n-channel differential amplifiers are coupled to respective biasing transistors.

17. The method of claim 13, further comprising providing a second output signal, the second output signal comprising a complementary differential output.

18. The method of claim 13, further comprising enabling each of said p-channel differential amplifier and said n-channel differential amplifiers.

* * * * *